(12) United States Patent
Fan et al.

(10) Patent No.: US 11,777,053 B2
(45) Date of Patent: Oct. 3, 2023

(54) LIGHT-EMITTING DIODE

(71) Applicant: KAISTAR Lighting(Xiamen) Co., Ltd., Xiamen (CN)

(72) Inventors: Ben-Jie Fan, Xiamen (CN); Jing-Qiong Zhang, Xiamen (CN); Yi-Qun Li, Xiamen (CN); Hung-Chih Yang, Xiamen (CN); Tsung-Chieh Lin, Xiamen (CN); Ho-Chien Chen, Xiamen (CN); Shuen-Ta Teng, Xiamen (CN); Cheng-Chang Hsieh, Xiamen (CN)

(73) Assignee: KAISTAR LIGHTING(XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 17/590,098

(22) Filed: Feb. 1, 2022

(65) Prior Publication Data

US 2022/0158026 A1    May 19, 2022

Related U.S. Application Data

(63) Continuation of application No. 16/629,367, filed as application No. PCT/CN2019/117645 on Nov. 12, 2019, now Pat. No. 11,257,980.

(30) Foreign Application Priority Data

Apr. 19, 2019    (CN) .......................... 201910318051.1

(51) Int. Cl.
*H01L 33/06*    (2010.01)
*H01L 33/14*    (2010.01)
(Continued)

(52) U.S. Cl.
CPC .............. *H01L 33/06* (2013.01); *H01L 33/14* (2013.01); *H01L 33/32* (2013.01); *H01L 33/502* (2013.01)

(58) Field of Classification Search
CPC ......... H01L 33/06; H01L 33/14; H01L 33/32; H01L 33/502
See application file for complete search history.

(56) References Cited

U.S. PATENT DOCUMENTS 8,022,388 B2 *    9/2011    Brandes .............. H01L 25/0753
257/79
8,575,592 B2    11/2013    Bergmann et al.
(Continued)

FOREIGN PATENT DOCUMENTS

CN    102623595 A    8/2012
CN    102822995 A    12/2012
CN    105514235 A    4/2016

*Primary Examiner* — Nikolay K Yushin
(74) *Attorney, Agent, or Firm* — Li & Cai Intellectual Property (USA) Office

(57) ABSTRACT

A light-emitting diode is provided. The light-emitting diode includes a P-type semiconductor layer, a N-type semiconductor layer, and a light-emitting stack located therebetween. The light-emitting stack includes a plurality of well layers and a plurality of barrier layers that are alternately stacked, the well layers includes at least one first well layer, at least one second well layer, and third well layers that have different indium concentrations. The first well layer has the largest indium concentration, and the third well layers have the smallest indium concentration. Three of well layers that are closest to the P-type semiconductor layer are the third well layers, and the first well layer is closer to the N-type semiconductor layer than the P-type semiconductor layer.

19 Claims, 28 Drawing Sheets

(51) Int. Cl.
*H01L 33/32* (2010.01)
*H01L 33/50* (2010.01)

(56) References Cited

U.S. PATENT DOCUMENTS

| | | |
|---|---|---|
| 2009/0206322 A1* | 8/2009 | Brandes .............. H01L 25/0753 257/13 |
| 2013/0082238 A1 | 4/2013 | Hsieh et al. |
| 2014/0284649 A1 | 9/2014 | Baumgartner et al. |
| 2020/0347999 A1 | 11/2020 | Li et al. |

* cited by examiner

LIGHT-EMITTING DIODE

CROSS-REFERENCE TO RELATED PATENT APPLICATION

This application is a continuation of U.S. application Ser. No. 16/629,367, filed on Jan. 8, 2020, which is the U.S. national stage of International Application No. PCT/CN2019/117645, filed on Nov. 12, 2019, entitled "LIGHT-EMITTING DIODE," the entire disclosures of which are incorporated herein by reference. The international application was published on Oct. 22, 2020, as International Publication No. WO2020/211346, and claims priority to China Patent Application No. 201910318051.1, filed on Apr. 19, 2019, in People's Republic of China, the contents of which are incorporated herein by reference in their entireties.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an epitaxial light-emitting structure of a light-emitting diode, and more particularly to an epitaxial light-emitting structure of a light-emitting diode for generating light with a broadband spectrum.

BACKGROUND OF THE DISCLOSURE

In the conventional technology, white light, which serves as a lighting source or a display light source, is generally generated by using narrowband blue light emitting diodes (LED) to excite fluorescence materials In the spectrum of white light generated by the aforementioned approach, a waveform of the spectrum has a sharp peak with high intensity at the section of the blue light. Therefore, how a blue light-emitting diode for generating a spectrum of blue light that conforms with the waveform of the blue band in a standard light source can be provided, so that a spectrum of white light generated by the blue light-emitting diode in conjunction with the fluorescence powder is similar to the natural light spectrum, is still an issue that researchers in this field are striving to achieve.

SUMMARY OF THE DISCLOSURE

In response to the above-referenced technical inadequacies, the present disclosure provides a light-emitting diode for generating light with a broadband spectrum.

In one aspect, the present disclosure provides a light-emitting diode. The epitaxial light-emitting structure includes a P-type semiconductor layer, a N-type semiconductor layer, and a light-emitting stack located therebetween. The light-emitting stack includes a plurality of well layers and a plurality of barrier layers that are alternately stacked, the well layers includes at least one first well layer, at least one second well layer, and third well layers having different indium concentrations. The first well layer has the largest indium concentration, and the third well layers have the smallest indium concentration. Three of well layers that are closest to the P-type semiconductor layer are the third well layers, and the first well layer is closer to the N-type semiconductor layer than the P-type semiconductor layer.

In one aspect, the present disclosure provides a light-emitting diode. The light-emitting diode includes a hole injection layer, an electron injection layer, and a light-emitting stack located between the hole injection layer and the electron injection layer to generate a light beam with a broadband blue spectrum. The light-emitting stack includes a plurality of well layers and a plurality of barrier layers that are alternately stacked, the well layers include at least one first well layer, at least one second well layer and third well layers that are different in indium concentrations. The first well layer has the largest indium concentrations, and the third well layers have the smallest indium concentration. A waveform of the broadband blue spectrum has at least two peaks.

In sum, one of the advantages of the present disclosure is that in the light-emitting diodes provided by the embodiments of the present disclosure, the spectrum of blue light that is generated by the light-emitting diode can have a larger FWHM or a plurality of peaks, by the technical features of "the well layers including at least one first well layer, at least one second well layer, and third well layers that are different in indium concentrations, the first well layer having the largest indium concentration, the third well layers having the smallest indium concentration" and "three of well layers that are closest to the P-type semiconductor layer being the third well layers, and the first well layer being closer to the N-type semiconductor layer than the P-type semiconductor layer."

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure related to "light-emitting diode" is more particularly described in the following examples that are intended as illustrative only since numerous modifications and variations therein will be apparent to those skilled in the art. The use of examples anywhere in this specification including examples of any terms is illustrative only, and in no way limits the scope and meaning of the present disclosure or of any exemplified term. Likewise, the present disclosure is not limited to various embodiments given herein.

Figure 1:
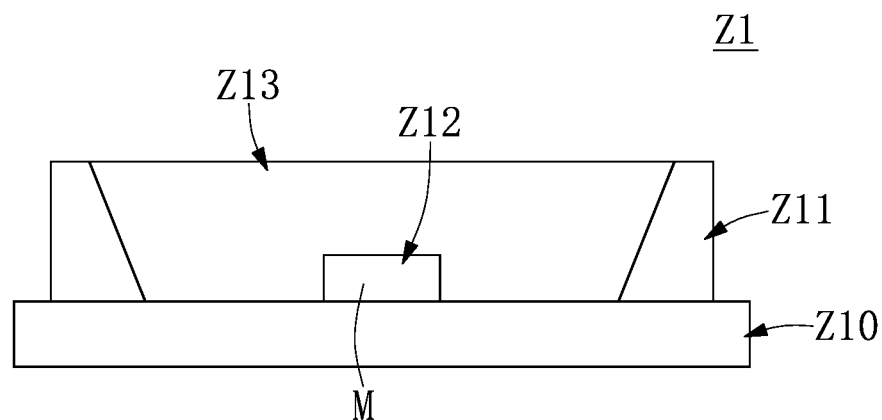
FIG. 1 is a sectional schematic view of a light-emitting diode module according to an embodiment of the present disclosure.

Reference is made to FIG. 1. FIG. 1 is a sectional schematic view of a light-emitting diode according to an embodiment of the present disclosure. In the embodiment of the present disclosure, the light-emitting diode module Z1 is used to generate a white light, and the spectrum of the white light is a full spectrum or a healthy spectrum.

As shown in FIG. 1, the light-emitting diode module Z1 includes a substrate Z10, a reflective assembly Z11, a light-emitting component Z12 and a wavelength-converting layer Z13.

The substrate Z10 has a die-bonding area defined thereon. In an embodiment, the material of the substrate Z10 can be selected from materials that have high thermal conductivity, high reflectivity and low transmittance for visible light beam, for example, metals or ceramics. In another embodiment, the substrate Z10 can include a high thermal conductivity substrate and a reflective layer coated thereon. The material of the substrate Z10 is not limited to a single or composite material in the present disclosure.

The reflective assembly Z11 and the light-emitting component Z12 are jointly disposed on the substrate Z10 for reflecting and guiding a light beam generated by the light-emitting component Z12 toward a specific direction. The reflective assembly Z11 surrounds the die-bonding area so as to define an accommodating space.

The light-emitting component Z12 is located at the die-bonding area of the substrate Z10 and positioned in the accommodating space defined by the reflective assembly Z11. The light-emitting component Z12 is used to generate a light beam with a broadband blue spectrum. The full width at half maximum (FWHM) of a waveform of the broadband blue spectrum of the light beam is at least 20 nm.

In an embodiment, the light-emitting component Z12 includes at least a light-emitting diode, and the light-emitting diode can be used to generate the light beam with a broadband blue spectrum. The detailed structure of the light-emitting diode will be further described later.

In another embodiment, the light-emitting component Z12 can include a plurality of light-emitting diodes, and the light-emitting diodes generate a plurality of blue light beams with different peak wavelengths, respectively. The plurality of blue light beams with different peak wavelengths are mixed to form the broadband blue light that is mentioned above.

The wavelength-converting layer Z13 is filled into the space defined by the reflective assembly Z11 and covers the light-emitting component Z12. After the broadband blue light beam generated by the light-emitting component Z12 passes through the wavelength-converting layer Z13, a white light with a specific spectrum can be generated. In the embodiments of the present disclosure, the spectrum of the white light generated by the light-emitting diode module Z1 is a full spectrum and is more similar to the natural light spectrum.

In an embodiment, the wavelength-converting layer Z13 includes at least a green fluorescence powder and a red fluorescence powder. The material of the green fluorescence powder can include lutetium aluminum garnet (LuAG) or gallium yttrium aluminum garnet (YGaAG) fluorescence powders, and the red fluorescence powder can be aluminum silicon nitride compound, such as calcium aluminum silicon nitride (CASN) compound, or can be strontium-silicon nitride compound ($Sr_2Si_5N_8$) or sulfur selenium compound ($Ca_2SeS$). In another embodiment, the wavelength-converting layer Z13 can further include a yellow fluorescence powder. The material of the yellow fluorescence powder can be, for example, yttrium aluminum garnet (YAG).

It should be mentioned that light beams with wavelengths respectively falling within different wavebands may result in different excitation efficiencies of the green fluorescence powder. Based on the material of the green fluorescence powder, light with a wavelength falling within a specific waveband may result in optimum excitation efficiency of the green fluorescence powder. As mentioned above, in the present embodiment, the light-emitting component Z12 includes at least a light-emitting diode, and the light-emitting diode can generate the light beam with a broadband blue spectrum. The detailed structure of the light-emitting diode of one embodiment of the present disclosure is described below.

Figure 2:
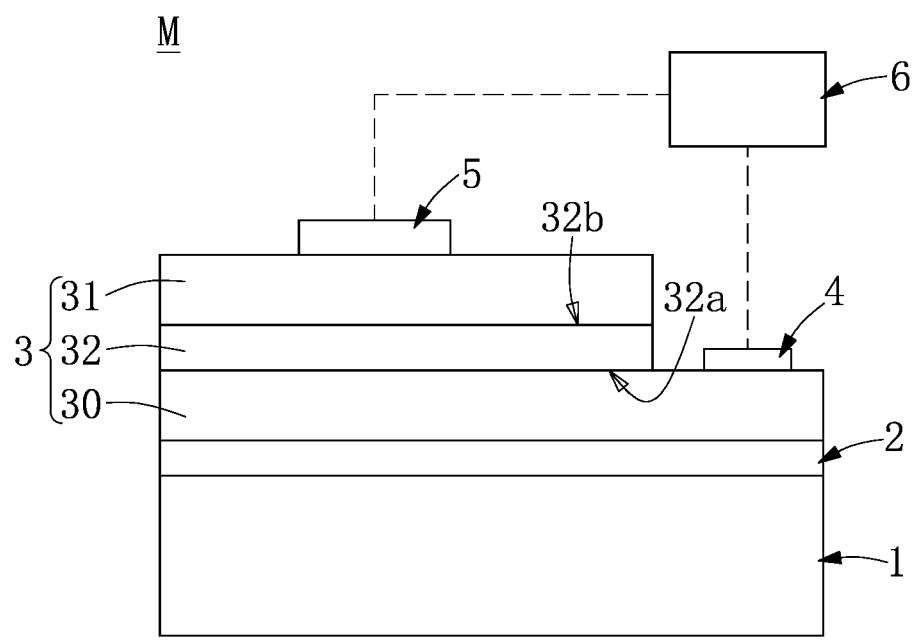
FIG. 2 is a schematic view of a light-emitting diode according to an embodiment of the present disclosure.
Figure 3:
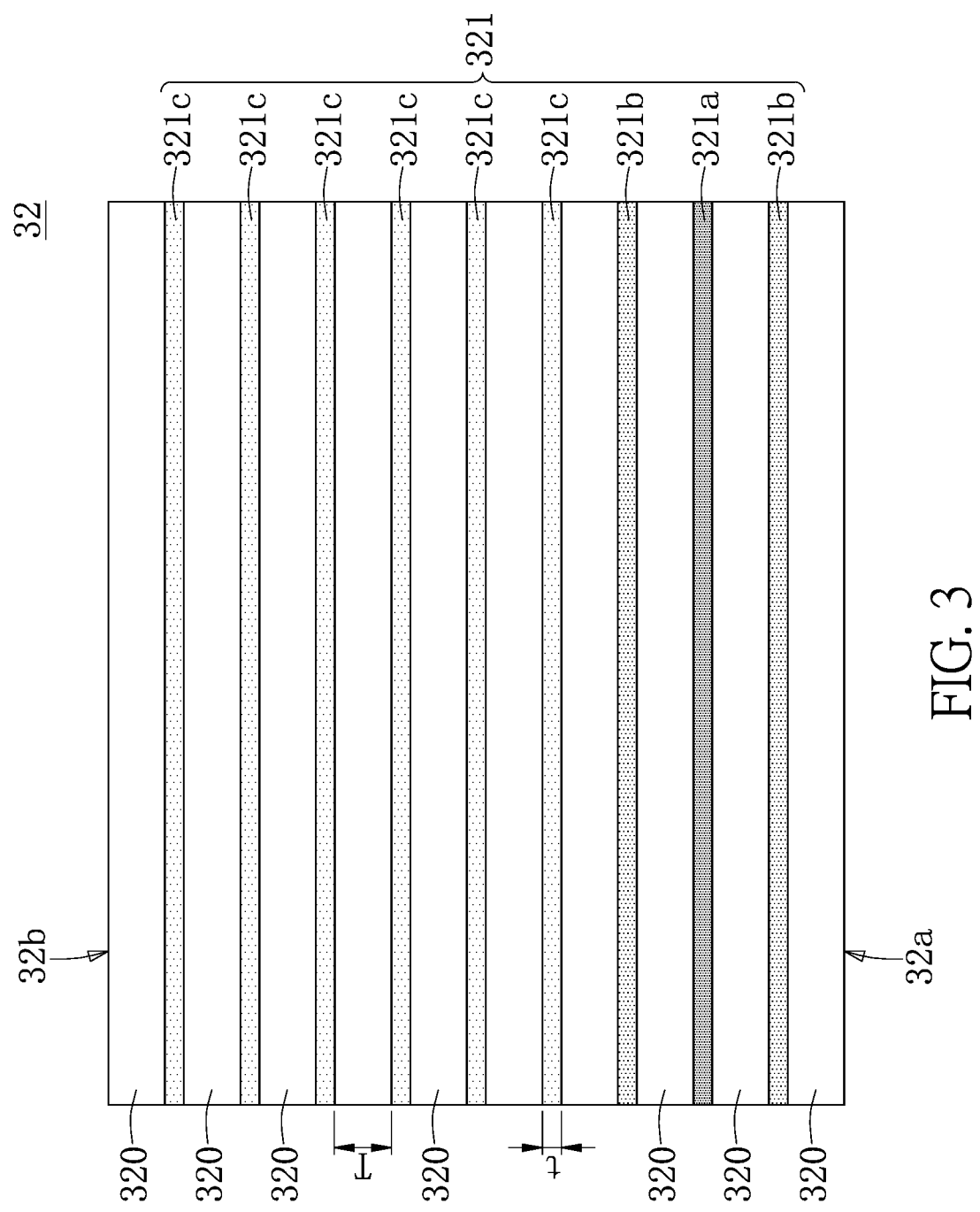
FIG. 3 is a schematic view of a light-emitting stack according to a first embodiment of the present disclosure.
Figure 4:
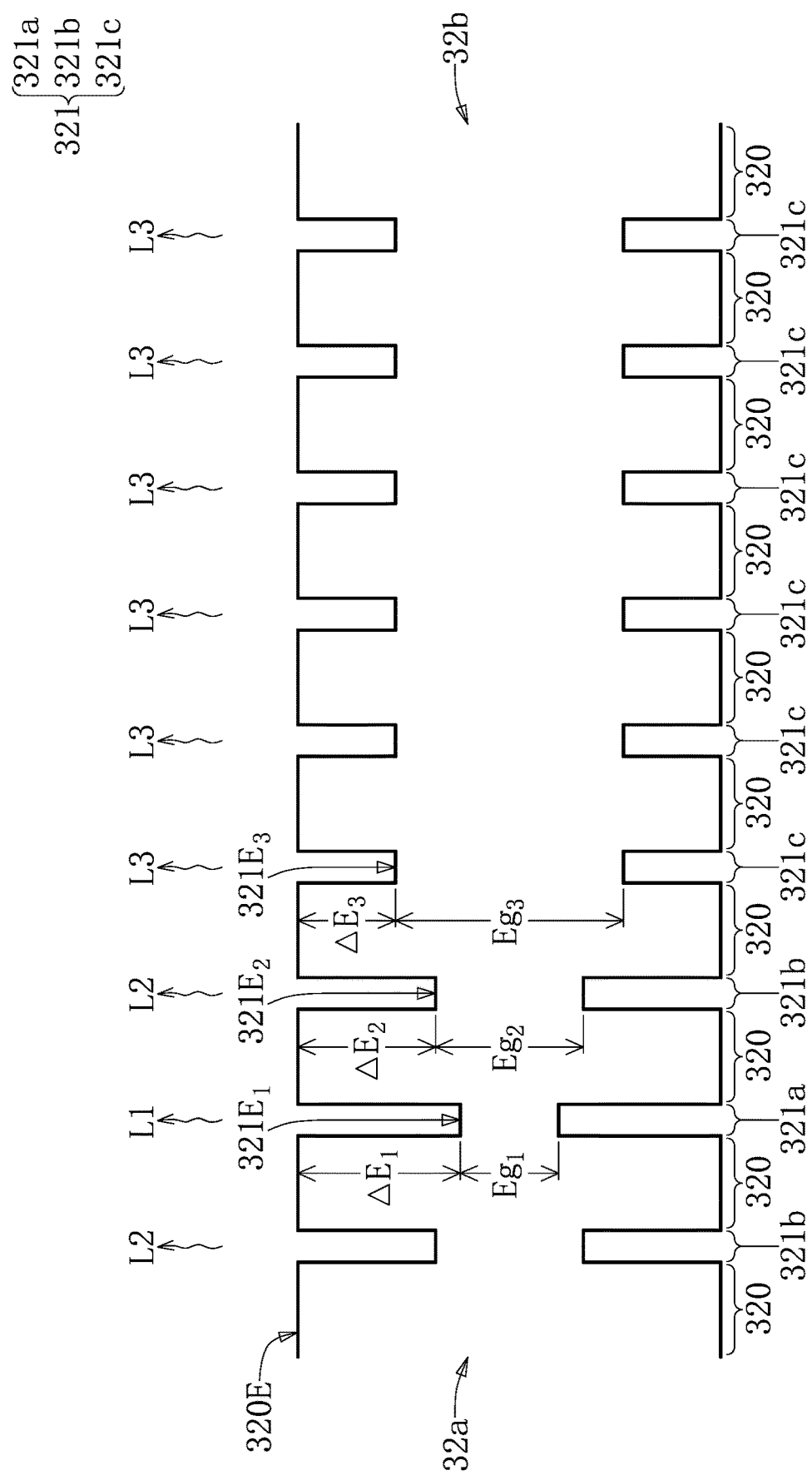
FIG. 4 is schematic view of an energy band structure of the light-emitting stack according to the first embodiment of the present disclosure.

Reference is made to FIG. 2 to FIG. 4. FIG. 2 is a schematic view of a light-emitting diode according to an embodiment of the present disclosure. FIG. 3 is a schematic view of a light-emitting stack of a first embodiment of the present disclosure, and FIG. 4 is schematic view of an energy band structure of the light-emitting stack according to the first embodiment of the present disclosure.

The light-emitting diode M of the embodiments of the present disclosure includes a substrate 1, a buffer layer 2, an epitaxial light-emitting structure 3, a first electrode 4 and a second electrode 5. The material of the substrate 1 may be materials that are suitable for epitaxial growth, such as sapphire, silicon carbide, gallium nitride or silicon. In the present embodiment, the material of the substrate 1 is sapphire. The buffer layer 2 is formed on the substrate 1 by an epitaxial process, and a lattice constant of the buffer layer 2 matches those of the materials of the substrate 1 and the epitaxial light-emitting structure 3. In an embodiment, the material of the buffer layer 2 may be aluminum nitride or gallium nitride.

Reference is still made to FIG. 2. The epitaxial light-emitting structure 3 is disposed on the buffer layer 2 and includes an N-type semiconductor layer 30, a P-type semiconductor layer 31, and a light-emitting stack 32. In the present embodiment, the N-type semiconductor layer 30 is disposed on the buffer layer 2, and the light-emitting stack 32 and the P-type semiconductor layer 31 are disposed on the N-type semiconductor layer 30 sequentially.

In addition, the width of the light-emitting stack 32 and the width of the P-type semiconductor layer 31 are both smaller than the width of the N-type semiconductor layer 30, so that a portion of the N-type semiconductor layer 30 is exposed. That is to say, the light-emitting stack 32 and the P-type semiconductor layer 31 jointly form a mesa portion. However, the embodiment depicted in FIG. 2 is not used to limit the scope of the present disclosure. In another embodiment, the positions of the N-type semiconductor layer 30 and the P-type semiconductor layer 31 can be exchanged with each other.

The first electrode 4 and the second electrode 5 are electrically connected to the N-type semiconductor layer 30 and the P-type semiconductor layer 31 for being electrically connected to an external control circuit 6, which can serve as a source of an operating current of the light-emitting diode M. In the present embodiment, the first electrode 4 is disposed on the N-type semiconductor layer 30, and the second electrode 5 is disposed on the P-type semiconductor layer 31 (i.e., on the mesa portion).

Furthermore, the N-type semiconductor layer 30 and the P-type semiconductor layer 31 can respectively serve as an electron injection layer and a hole injection layer so as to provide electrons and holes. In another embodiment, the material of the N-type semiconductor layer 30 is gallium nitride doped with silicon. In addition, the material of the P-type semiconductor layer 31 is gallium nitride doped with magnesium or aluminum gallium nitride doped with magnesium.

The light-emitting stack 32 is located between the N-type semiconductor layer 30 and the P-type semiconductor layer 31 and has a first side 32a close to the N-type semiconductor 30 and a second side 32b closer to the P-type semiconductor layer. The light-emitting stack 32 is used to generate a light beam with a broadband blue spectrum.

Specifically, by applying a bias between the first electrode 4 and the second electrode 5 through the external control circuit 6, a current passing through the N-type semiconductor layer 30, the light-emitting stack 32 and the P-type semiconductor layer 31 can be generated, so that the light-emitting stack 32 is excited and generates the light beam with a specific waveband. In the present embodiment, the broadband blue spectrum of the light beam generated by the light-emitting stack 32 has a broader full width at half maximum (FWHM), or a plurality of peaks. In an embodiment, the FWHM of a waveform of the spectrum of the light beam is at least 20 nm.

Reference is made to FIG. 3 and FIG. 4. In the present embodiment, the light-emitting stack 32 is an alternately layered structure and has a multiple quantum well structure. In other words, the light-emitting stack 32 includes a plurality of barrier layers 320 and a plurality of well layers 321 stacked alternately. As shown in FIG. 3, the thickness T of each of the barrier layers 320 is larger than the thickness t of any one of the well layers 321.

The thickness T of the barrier layer 320 and the thickness t of the well layer would affect the waveform of the broadband blue spectrum generated by the light-emitting stack 32. It should be noted that the thickness of the conventional barrier layer is about 2 to 3.5 times that of the well layer. Specifically, the thickness of the conventional barrier layer ranges from 8.5 nm to 10.5 nm. However, the waveform of the spectrum may be easily distorted due to a variation of the operating current.

Therefore, in an embodiments of the present disclosure, the ratio of the thickness T of the barrier layers 320 to the thickness t of the well layers 321 ranges from 2.5 to 5, preferably from 3 to 4. Therefore, compared to the conventional technique, the negative effect on the waveform of the spectrum resulted from the variation of the operating current can be attenuated in the present disclosure. Preferably, the thickness T of the barrier layers 320 ranges from 8.5 nm to 15 nm, preferably from 9.5 nm to 15 nm. In addition, the thickness t of the well layers 321 ranges from 2.5 nm to 4.5 nm.

In addition, although the well layers have substantially the same thickness t in the present embodiment, the present disclosure is not limited thereto. In another embodiment, it is not necessary for the barrier layers 320 to have the same thickness T. Similarly, it is not necessary for the well layers 321 to have the same thickness t. For example, at least two barrier layers 320 may have different thicknesses, or at least two of the well layers 321 may have different thicknesses.

Reference is made to FIG. 4. The energy band gap of each of the barrier layers 320 is greater than the energy band gap of any one of the well layers 321 so that the light-emitting stack 32 has a multiple quantum well structure.

In the present embodiment, the plurality of well layers 321 can each has different energy band gaps, so as to generate a plurality of sub-light beams with different wavelengths. The sub-light beams can be mixed with one another to form the light beam with a broadband blue spectrum.

In the present embodiment, the well layers 321 can be divided into first well layers 321a, second well layers 321b and third well layers 321c according to the value of the energy band gap thereof. The energy band gap $Eg_1$ of the first well layers 321a is smaller than the energy band gap $Eg_2$ of the second well layers 321b, and the energy band gap $Eg_2$ of the second well layers 321b is smaller than the energy band gap $Eg_3$ of the third well layers 321c.

It should be noted that the energy band gap of the well layer 321 is inversely proportional to the wavelength of the sub-light beam generated therefrom. That is, the larger the energy band gap of the well layer 321 is, the smaller the wavelength of the sub-light beam generated by the well layer 321 is. Accordingly, the first well layers 321a may be used to generate a first sub-light beam L1 with a first wavelength. The second well layers 321b may be used to generate a second sub-light beam L2 with a second wavelength, and the third well layers 321c may be used to generate a third sub-light beam L3 with a third wavelength. In an embodiment, a difference between the first wavelength and the second wavelength ranges from 1 nm to 50 nm.

In an embodiment, the difference between the first wavelength and the third wavelength ranges from 20 nm to 70 nm. Furthermore, the difference between the first wavelength and the second wavelength ranges from 10 nm to 30 nm, and the difference between the second wavelength and the third wavelength ranges from 10 nm to 30 nm.

The energy band gaps of the well layers 321 can be adjusted to have different widths according to the desired waveform of the spectrum, such that the difference between the two wavelengths of any two of the first sub-light beam L1, the second sub-light beam L2 and the third sub-light beam L3 (such as between the first and second wavelengths, the first and third wavelengths or the second and the third wavelengths) can be adjusted.

In addition, in order to consider the excitation property of the green fluorescence powder in the wavelength converting layer Z13 and to obtain a broadband blue spectrum that is similar to a waveform of the standard light source at blue waveband, a sub-light beam with preferable excitation property toward green fluorescence power may have a greater intensity.

Therefore, in the present embodiment, the plurality of well layers 321 are used to generate sub-light beams each has a wavelength falling within the blue waveband. However, the sub-light beams generated by the first well layer 321a, the second well layer 321b and the third well layers 321c respectively have different peak wavelengths.

Furthermore, the barrier layer 320 is a gallium nitride (GaN) layer, and the well layer 321 is a gallium indium nitride ($In_xGa_{1-x}N$) layer. Since the indium concentration of the well layer 321 affects the energy band gap of the well layer 321, the energy band gap of the well layer 321 can be adjusted by controlling the indium concentration in each of the well layers 321, so as to control the wavelength of the sub-light beam generated by the well layer 321. Reference is made to the Table 1 below. Table 1 shows the relationships between the indium concentrations (%) and the wavelength of the sub-light beams that are calculated by theoretical calculation.

TABLE 1

| Wavelength (nm) | 430 | 435 | 440 | 445 | 450 | 455 | 460 | 465 | 470 |
|---|---|---|---|---|---|---|---|---|---|
| Indium concentration (%) | 12.4 | 13.3 | 14.1 | 14.9 | 15.7 | 16.5 | 17.3 | 18.1 | 18.8 |

Specifically, the lower the indium concentration is, the larger the energy band gap is and the shorter the wavelength of the sub-light beam generated therefrom is. In one embodiment, the first well layer 321a has a first indium concentration, and the second well layer 321b has a second indium concentration. The first indium concentration of the first well layer 321a is larger than the indium concentrations of other ones of the well layers 321. Furthermore, the first indium concentration is larger than the second indium concentration, and the first indium concentration differs from the second concentration by at least 0.5%.

In another embodiment, the indium concentration of the first well layer 321a ranges from 18% to 20%, the indium concentration of the second well layer 321b ranges 15% to 17%, and the indium concentration of the third well layer 321c ranges from 12% to 14%. Therefore, the broadband blue spectrum of the light beam generated by the light-emitting stack 32 is more approximate to the wave profile of a standard light source (white light) at the blue waveband. In an embodiment, the broadband blue spectrum of the light beam generated by the light-emitting stack 32 is approximate to the wave profile of the standard light source (white light) with a color temperature of more than 4000K at the blue waveband.

For example, the first wavelength of the first sub-light beam L1 generated by the first well layer 321a may fall within a range from 455 nm to 485 nm. The second wavelength of the second sub-light beam L2 generated by the second well layer 321b may fall within a range from 435 nm to 455 nm. The third wavelength of the third sub-light beam L3 generated by the third well layer 321c may fall within a range from 425 nm to 435 nm.

On the other hand, the indium concentration of the well layers 321 is related to the growing temperature thereof. The higher the growing temperature of the well layer 321 is, the lower the indium concentration is. Accordingly, forming the well layers 321 under different growing temperatures may result the well layers 321 having different energy band gaps $Eg_1$~$Eg_3$.

In an embodiments of the present disclosure, at least two well layers 321 among the well layers 321, for example, the third well layer 321c and the first well layer 321a, have different energy band gaps $Eg_1$~$Eg_3$.

In addition, at least one of the first well layers 321a, two of the second well layers 321b and two of the third layers 321c are included in the well layers 321. However, the numbers of the first well layers 321a, the second layers 321b and the third layers 321c may vary based on actual implements.

Reference is made to FIG. 4. A first barrier height $\Delta E_1$ is formed between a conductive band $321E_1$ of the first well layer 321a and a conductive band 320E of the barrier layer 320. A second barrier height $\Delta E_2$ is formed between a conductive band $321E_2$ of the second well layer 321b and a conductive band 320E of the barrier layer 320. A third barrier height $\Delta E_3$ is formed between a conductive band $321E_3$ of the third well layer 321c and a conductive band 320E of the barrier layers 320. The third barrier height $\Delta E_3$ is smaller than the second barrier height $\Delta E_2$, and the second barrier height $\Delta E_2$ is smaller than the first barrier height $\Delta E_1$. Therefore, compared to the third well layer 321c, it is more easily for electrons to be trapped within the first well layer 321a, such that the more sub-light beams with a longer wavelength (first sub-light beams L1) can be generated.

Therefore, in an embodiment, the number of the first well layers 321a is smaller than the numbers of the third well layers 321c and the second well layers 321b so as to prevent the intensity of the sub-light beam with shorter wavelength (the third sub-light beam L3) or the sub-light beam with medium wavelength (the second sub-light beam L2) in the spectrum from being too low. Accordingly, the intensity of the first sub-light beam L1 is lower than that of the third sub-light beam L3.

In addition, the mobility of holes is lower than that of electrons. Therefore, the main light-emitting area of the light-emitting stack 32 is closer to the P-type semiconductor layer 31. Since it is more easily for electrons to be trapped in the first well layers 321a than in the third well layers 321c, at least the well layer 321 that is closest to the P-type semiconductor layer 30 is the third well layer 321c in the embodiments of the present disclosure, so as to prevent the intensity of the sub-light beam with a longer wavelength (the first sub-light beam L1) from being excessive.

That is to say, the first well layers 321a and the P-type semiconductor layer 31 are separated from each other by at least another well layer, such as a second well layer 321b or a third well layer 321c. In the present embodiment, at least three of well layers 321 that are closest to the P-type semiconductor layer 31, i.e., the three well layers that are closest to the second side 32b, are the third well layers 321c so as to prevent the ratio of the intensity of the sub-light beams with a shorter wavelength (the third sub-light beams L3) to the sub-light beams with a longer wavelength (the first sub-light beams L1) from being too low, thereby affecting the waveform of the white light spectrum.

On the other hand, based on actual experimental results, if the well layer 321 that is closest to the N-type semiconductor layer 30 is the first well layer 321a, the intensity of the sub-light beams with a longer wavelength (the first sub-light beam L1) is too weak to increase the FWHIM of the spectrum. Accordingly, the first well layer 321a and the N-type semiconductor layer 30 is separated from each other by at least another well layer, such as the second well layer 321b or the third well layer 321c.

In another embodiment, if the light-emitting diode has different number of quantum wells, the well layer that is the second closest to the N-type semiconductor layer 30 (or the first side 32a) is not limited to be the first well layer 321a. Furthermore, the location of the first well layer 321a affects the intensity of the sub-light beam with a longer wavelength. For example, the closer to the N-type semiconductor layer 30 the location of the first well layer 321a is, the weaker the intensity of the light emitted from the first well layer 321ais. Different locations may be suitable for generating different light intensities. Overall, in order to achieve a waveform of the white light spectrum that is nearly identical to that of the full spectrum after exciting fluorescence powder by a light-emitting diode, the locations of the first well layers 321a are closer to the side that is close to the N-type semiconductor layer 30 in the multiple quantum well.

In the present embodiment, the well layer 321 that is closest to the N-type semiconductor layer 30, i.e., the well layer closest to the first side 32a, is a second well layer 321b. In addition, the well layer 321 that is the second closest to the N-type semiconductor layer 30 (the first side 32a) is a first well layer 321a. As such, the first well layer 321a can have a preferable light-emitting efficiency. In the embodiment shown in FIG. 4, the well layer 321 that is the third closest to the N-type semiconductor layer 30 is a second well layer 321b.

Furthermore, other well layers 321 located in the middle section of the light-emitting stack 32, i.e., located between the well layer 321 that is the third closest to the first side 32a (i.e., the second well layer 321b) and the well layer 321 that is the third closest to the second side 32b (i.e., the third well layer 321c) may be third well layers 32c, second well layers 321b, or the combination thereof.

Figure 5:
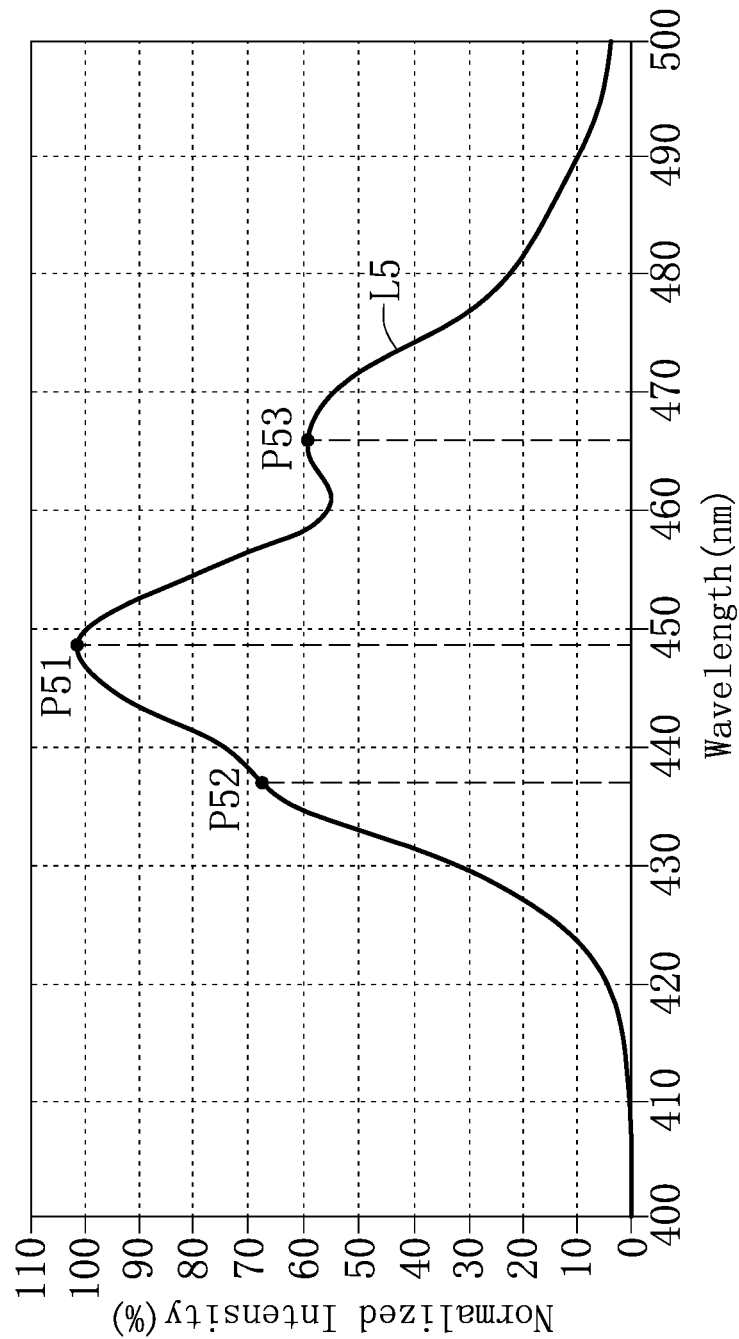
FIG. 5 is a broadband blue spectrum of a light-emitting diode according to the first embodiment of the present disclosure.

Reference is made to FIG. 5. FIG. 5 shows the broadband blue spectrum according to the first embodiment of the present disclosure. That is, based on the technical means described above, the spectrum shown in FIG. 5 can be obtained by mixing the first sub-light beam L1, the second sub-light beam L2 and the third sub-light beam L3 generated by the light-emitting diode M.

As shown in FIG. 5, the waveform L5 of the broadband blue spectrum of the present embodiment has a main peak with a main peak point P51. In addition, in the broadband blue spectrum of the present disclosure, at least a shoulder peak is presented at the left side (shorter wavelength) or the right side (longer wavelength) of the main peak point P51. As shown in FIG. 5, in the waveform L5 of the broadband blue spectrum of the present embodiment, in addition to the main peak, two shoulder peaks are located on the left and ride side of the main peak point P51, respectively.

Furthermore, the main peak point P51 corresponds to a highest luminous intensity and may fall within a range from 435 nm to 455 nm. The main peak point P5 of the present embodiment corresponds to a wavelength of 449 nm.

In addition, one of the shoulder peaks is located in a range between a wavelength of 410 nm and a wavelength that is equal to the wavelength corresponding to the main peak point P51 minus 5 nm. In the present embodiment, the one of the shoulder peaks is located between a wavelength of 410 nm and 444 nm, where a relative maximum value or an inflection point P52 is presented. The location of the shoulder peak P52 in the present embodiment corresponds to a wavelength of 437 nm.

In addition, another shoulder peak is located in a range between a wavelength of 490 nm and a wavelength that is equal to the wavelength corresponding to the main peak point P51 plus 10 nm. In the present embodiment, the shoulder peak is located in a range from 459 nm to 490 nm, where a relative maximum value or an inflection point P53 is presented. The location of the shoulder peak P53 in the present embodiment corresponds to a wavelength of 466 nm.

In general, a relative maximum value or an inflection point P52 is located in a range from 425 nm to 435 nm, and another relative maximum value or an inflection point P53 is in a range from 455 nm to 485 nm. The intensity that the main peak point P51 corresponds to is highest.

In the present embodiment, the intensity of the main peak point P51 is defined as 100% so as to normalize the waveform of the spectrum.

In addition, the intensity of the relative maximum value or the inflection point P52 (located at the shorter wavelength side) is higher than an intensity of the relative maximum value or the inflection point P53 (located at the longer wavelength side). For example, the intensity of the main peak point P51 is 100%, an intensity of one of the relative maximum value or inflection point P52 is between 10 to 60%, and an intensity of another one of the relative maximum value or inflection point P53 is between 20 to 90%. Therefore, the spectrum of white light generated by the broadband blue light passing through the wavelength converting layer Z13 is a full spectrum.

Figure 6:
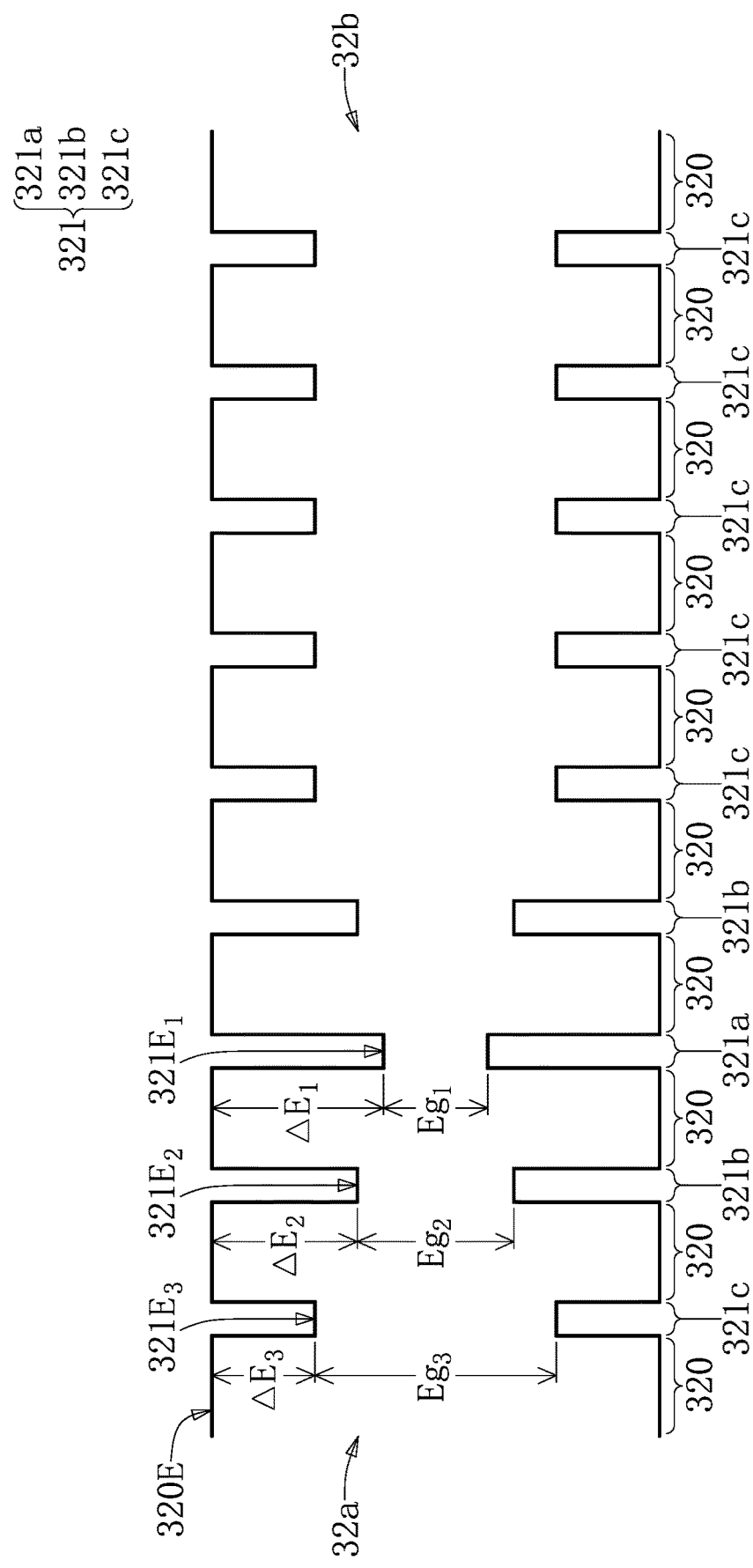
FIG. 6 is a schematic view of an energy band structure of a light-emitting stack according to a second embodiment of the present disclosure.

Reference is made to FIG. 6. FIG. 6 is a schematic view of an energy band structure of a light-emitting stack of the second embodiment of the present disclosure. In the present embodiment, the well layer 321 that is closest to the N-type semiconductor layer 30 (the first side 32a) is a third well layer 321c, and the well layer 321 that is the second or third closest to the N-type semiconductor layer 30 (the first side 32a) is a second well layer 321b. Therefore, the third well layer 321c can have a better light-emitting efficiency. In the embodiment shown in FIG. 6, the well layer 321 that is the second closest to the N-type semiconductor layer 30 is a second well layer 321b, and the well layer 321 that is the third closest to the N-type semiconductor layer 30 is a first well layer 321a.

In addition, the well layer 321 that is closest to the P-type semiconductor layer (the second side 32a) is a third well layer 321c, and the other well layers 321 located at the middle section of the light-emitting stack 32, i.e., the other well layers 321 between the well layer 321 that is the third closest to the first side 32a (i.e., the first well layer 321a) and the well layer 321 that is the third closest to the second side 32b (i.e., the third well layer 321c) can be the third well layers 321c, the second well layers 321b or any combination thereof. The present disclosure is not limited thereto.

Figure 7:
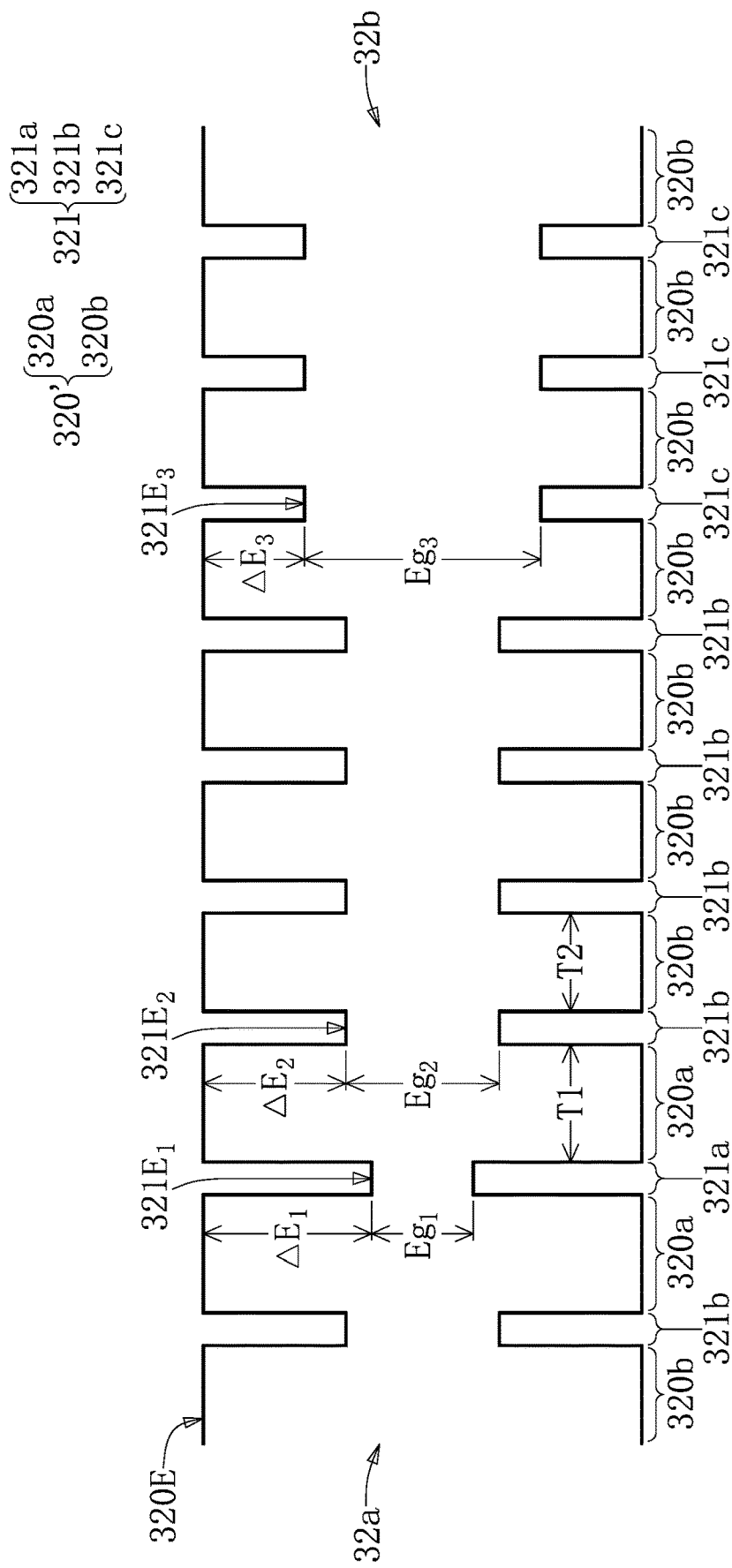
FIG. 7 is a schematic view of an energy band structure of a light-emitting stack according to a third embodiment of the present disclosure.

Reference is made to FIG. 7. FIG. 7 is a schematic view of the energy band structure of the light-emitting stack according to the third embodiment of the present disclosure. As shown in FIG. 7, a difference between the present embodiment and the first embodiment is that the barrier layers 320' can each has different thicknesses in the present disclosure. Furthermore, the barrier layers 320' includes at least two first barrier layers 320a and at least a second barrier layer 320b (a plurality of second barrier layers 320b are illustrated in FIG. 7).

The two first barrier layers 320a are located at the two opposite sides of one of the first well layers 321a. In other words, one of the first well layers 321a is sandwiched between the two first barrier layers 321a. Specifically, the well layer 321 that is the second closest to the N-type semiconductor layer 30 is a first well layer 321a, and the first well layer 321a (i.e., the well layer 321 that is the second closest to the N-type semiconductor layer 30) is sandwiched between the two first barrier layers 320a.

The thickness T1 of each of the first barrier layer 320a is larger than the thickness T2 of the second barrier layer 320b. Furthermore, in an embodiment, the thickness T1 of the first barrier layer 320a is 1 to 1.5 times the thickness T2 of the second barrier layer 320b. Preferably, the thickness T1 of the first barrier layer 320a is 1.2 to 1.5 times the thickness T2 of the second barrier layer 320b.

From another aspect, the thickness T1 of the first barrier layer 320a differs from the thickness T2 of the second barrier layer 320b by at least 5%. In other words, if the difference between the thickness T1 of the first barrier layer 320a and the thickness T2 of the second barrier layer 320b is defined as D, and D=T1−T2, (D/T1)*100% is at least 5%.

Therefore, only the thicknesses of the two first barrier layers 320a that are connected to the first well layer 321a is 2.5 to 5 times the thickness of the well layer, and the thicknesses of the second barrier layers 320b are still 2 to 3.5 times the thickness of the well layers 321. In other words, it is not necessary for each of the barrier layers 320 to be thickened to a thickness that is 2.5 to 5 times the thickness of the well layer; instead, only the thicknesses of the two first barrier layers 320a connected to the first well layer 321a are increased. Compared to the conventional technique, in the present embedment, an effect on the waveform generated by the light-emitting stack 32, which is resulted from a variation of the operating current, can be reduced.

In another embodiment, the second barrier layers 320b can each have different thickness. To be more specific, the thickness of the second barrier layer 320b that is adjacent to one of the third well layers 321c can be different from (for example, smaller than) the thickness of the second barrier layer 320b that is adjacent to one of the second well layer 321b.

Moreover, other well layers 321 located in the middle section of the light-emitting stack 32, i.e., other well layers 321 located between the well layer 321 that is the third closest to the first side 32a (i.e., the second well layer 321b) and the well layer 321 that is the third closest to the second side 32b (i.e., the third well layer 321c), can be the third well layers 321c, the second well layers 321b or the combination thereof. The present disclosure is not limited thereto. In the embodiment shown in FIG. 7, all of other well layers 321 in the middle section of the light-emitting stack 32 are the second well layers 321b.

It should be mentioned that when the light-emitting diode M of the present embodiment is operated under an operating current density ranging between 100 mA/mm$^2$ to 300 mA/mm$^2$, the first luminous intensity of the first sub-light beam L1 is lower than the second luminous intensity of the second sub-light beam L2. Furthermore, a ratio of the first luminous intensity to the second luminous intensity ranges from 0.1 to 0.9.

Figure 8:
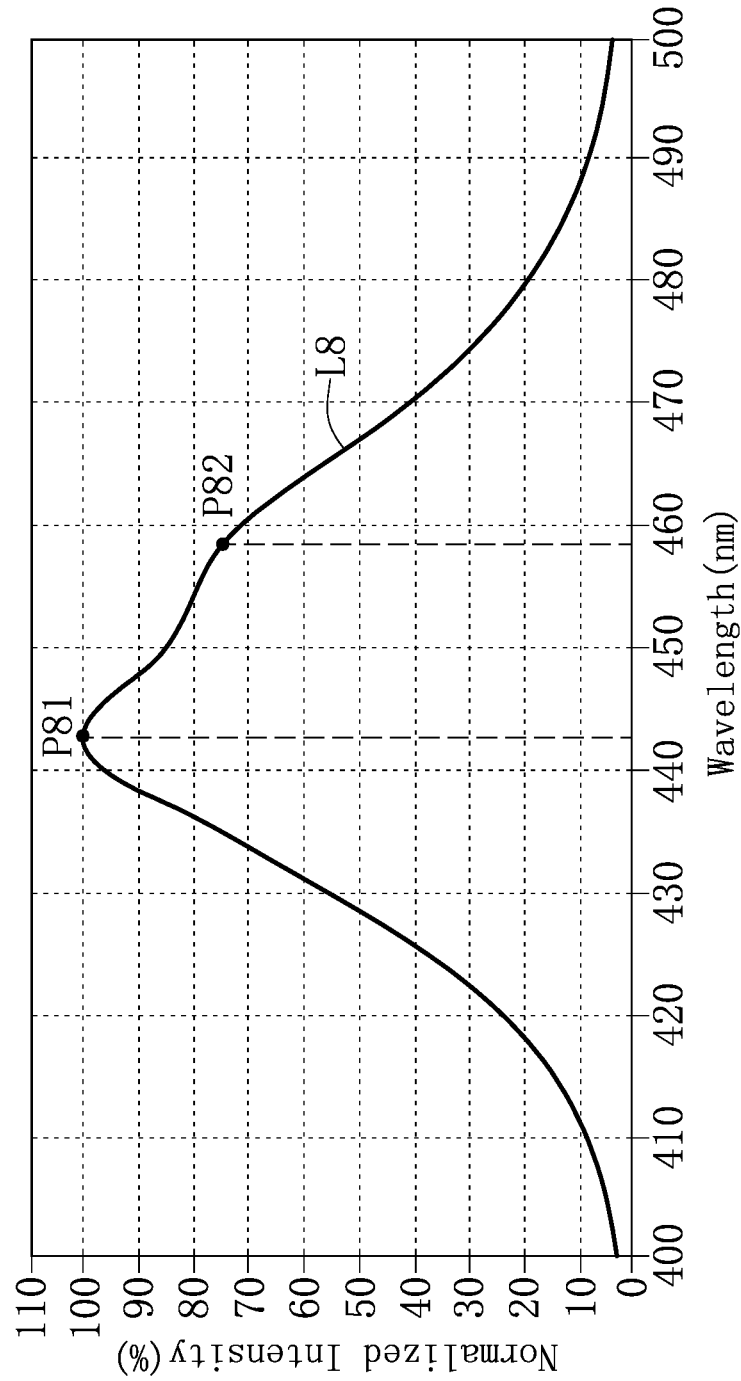
FIG. 8 is a broadband blue spectrum of a light-emitting diode according to the third embodiment of the present disclosure.

Reference is made to FIG. 8. FIG. 8 is a broadband blue spectrum of a light-emitting diode according to the third embodiment of the present disclosure. One of differences between the broadband blue spectrum of FIG. 8 and that of the FIG. 5 is that the spectrum waveform L8 of the broadband blue spectrum includes a main peak and a shoulder peak located at the right side of the main peak (longer wavelength side). The spectrum waveform L8 includes a main peak point P81 and an inflection point P82 (or a relative maximum) located at the right side of the main peak point P81.

The main peak point P81 is located within a wavelength range of from 430 nm to 455 nm and corresponds to a maximum intensity. In an actual embodiment, the main peak point P81 is located at a wavelength of 442 nm. The inflection point (or the relative maximum) P82 is an inflection presented at the range between a wavelength that is equal to the wavelength corresponding to the main peak point P81 plus 10 nm and 490 nm. In an actual embodiment, the inflection point P82 is located within a range from 455 nm to 475 nm. In addition, the difference between the wavelength (corresponding to the main peak point P81) and the wavelength (corresponding to the inflection point (or the relative maximum) P82) ranges from 10 to 30 nm.

As mentioned above, the intensity corresponding to the main peak point P81 will be higher than the intensity corresponding to the inflection point (or the relative maximum). In the present embodiment, the intensity corresponding to the main peak point P81 is defined as 100% to normalize the spectrum waveform L8. Accordingly, the intensity corresponding to the inflection point (or the relative maximum) P82 ranges from 20% to 90%. In the embodiment shown in FIG. 8, the intensity corresponding to the inflection point (or the relative maximum) P82 ranges from 70% to 90%. Therefore, the spectrum of the white light generated by the broadband blue light passing the wavelength-converting layer Z13 is a full spectrum.

It should be noted that, the energy band gap $Eg_1$ of the first well layer 321a will affect the FWHM of the waveform of the broadband blue spectrum. Furthermore, in the broadband blue spectrum, the energy band gap $Eg_1$ of the first well layer 321a is related to the relative positions between the peak point of the main peak and the peak point of the shoulder peak located at the right side of the main peak. In other words, in the broadband blue spectrum generated by the light-emitting stack 32, the peak point (such as the inflection point P82 shown in FIG. 8) of a shoulder peak that is located at the right side of the main peak will shift toward longer wavelength relative to the peak point of the main peak (such as the main peak point P81 shown in FIG. 8) as the energy band gap $Eg_1$ of the first well layer 321a decreases.

Figure 9:
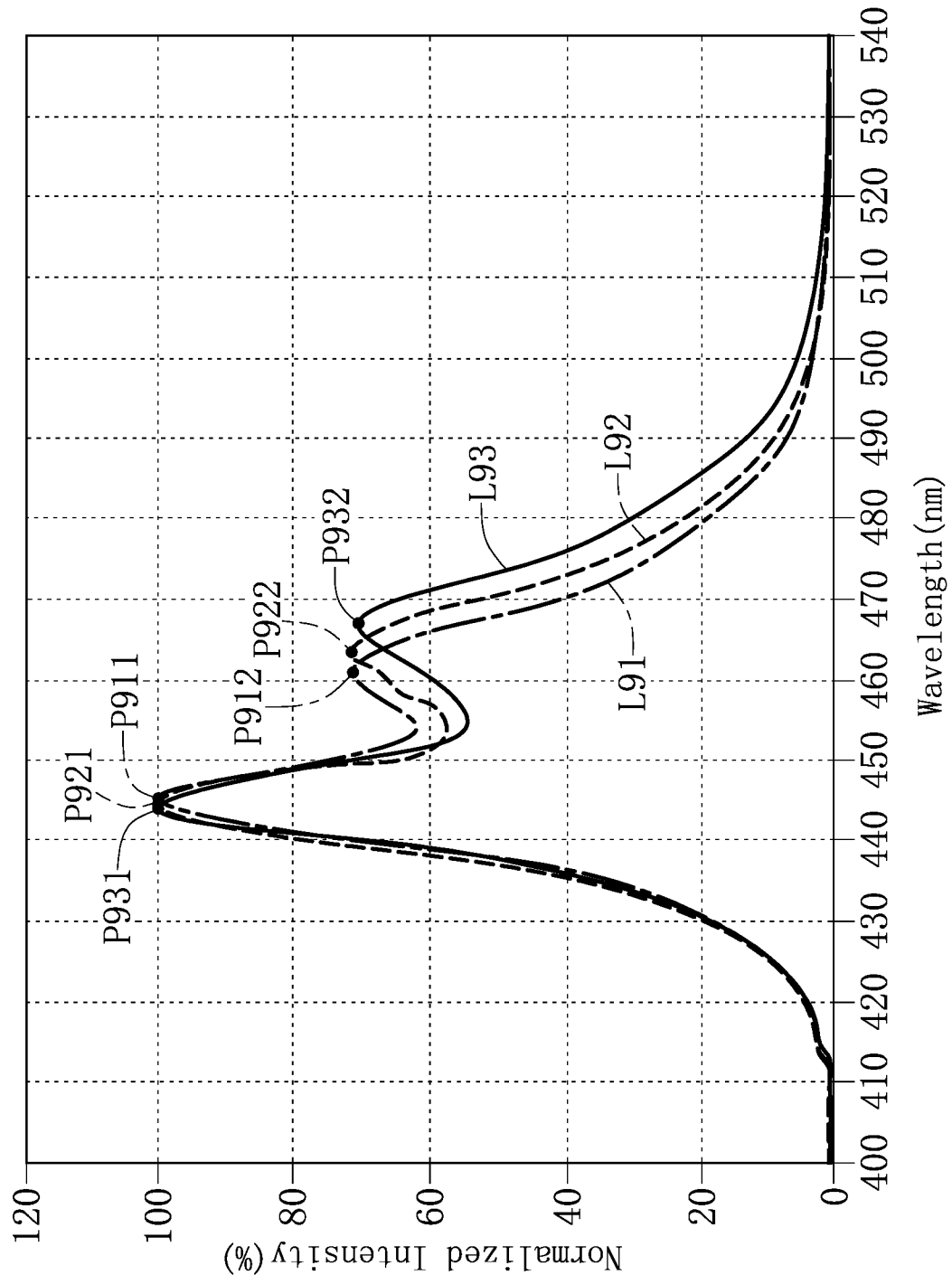
FIG. 9 shows broadband blue spectrums of different light-emitting diodes of the present disclosure measured before packaging.

Reference is made to FIG. 9. FIG. 9 is a broadband blue spectrum of different light-emitting diodes of the present disclosure measured before packaging. FIG. 9 shows the spectrums of the light-emitting diode M measured by spot metering before the light-emitting diode M being packaged.

As shown in FIG. 9, it is described by taking the broadband blue spectrums generated by the light-emitting stack 32 shown in FIG. 7 as examples. Specifically, the waveforms L91, L92, L93 of the three broadband blue spectrums shown in FIG. 9 correspond to three different light-emitting stacks 32, respectively. The sequence of the barrier layer 320' and the well layers 321 of these three light-emitting stacks 32 is the same as that of the embodiment shown in FIG. 7. However, the first well layers 321a of these three light-emitting stacks 32 respectively have different energy band gaps $Eg_1$.

The waveform L91 represents that the energy band gap $Eg_1$ of the first well layer 321a of the light-emitting stack 32 is the widest, the waveform L92 represents that the energy band gap $Eg_1$ of the first well layer 321a of the light-emitting stack 32 is the second widest, and the waveform L93 represents that the energy band gap $Eg_1$ of the first well layer 321a of the light-emitting stack 32 is narrowest.

As shown in FIG. 9, the waveforms L91, L92, L93 all have a main peak and a shoulder peak located at the right side of the main peak. It should be noted that each of the waveforms L91, L92, L93 are formed by mixing the first sub-light beam L1, the second sub-light beam L2 and the third sub-light beam L3 generated by the light-emitting stack 32. The main peak of each of the waveforms L91, L92, L93 may correspond to the second sub-light beam L2 generated by the second well layer 321b, and the shoulder peak located at the right side of the main peak may correspond to the first sub-light beam L1 generated by the first well layer 321a.

The main peak of each of the waveforms L91, L92, L93 has a main peak point (P911, P921, P931). In the present embodiment, the intensity of the main peak point P911 of the waveform L91 is defined as 100% so as to normalize the waveform L91. Similarly, the intensity of the main peak point P921 of the waveform L92 is defined as 100%, and the main peak point P931 of the waveform L93 is defined as 100% for normalizing the waveforms L92, L93, respectively.

As shown in FIG. 9, the main peaks of the waveforms L91, L92, L93 are approximately overlapped with one another and the main peak points P911, P921, P931 of the three main peaks are approximately the same. However, compared the waveform L93 with the waveform L92, owing to the difference between the energy band gaps $Eg_1$ of the first well layers 321a, a difference between the wavelength (about 467 nm) corresponding to the peak point P932 of the shoulder peak and the wavelength (about 445 nm) corresponding to the main peak point P931 of the main peak of the waveform L93 is greater than a difference between the wavelength (about 463 nm) corresponding to the peak point P922 of the shoulder peak and the wavelength (about 445 nm) corresponding to the main peak point P921 of the main peak.

Similarly, a difference between the wavelength (about 463 nm) corresponding to the peak point P922 of the shoulder peak and the wavelength (about 445 nm) corresponding to the main peak point P921 of the main peak in the waveform L92 is greater than a difference between the wavelength (about 460 nm) corresponding to the peak point P912 of the shoulder peak and the wavelength (about 445 nm) corresponding to the main peak point P911 of the main peak in the another waveform L91. That is, the narrower the energy band gap $Eg_1$ is, the farther away the peak point of the shoulder peak is from the main peak point of the main peak in the broadband blue spectrum.

Figure 10:
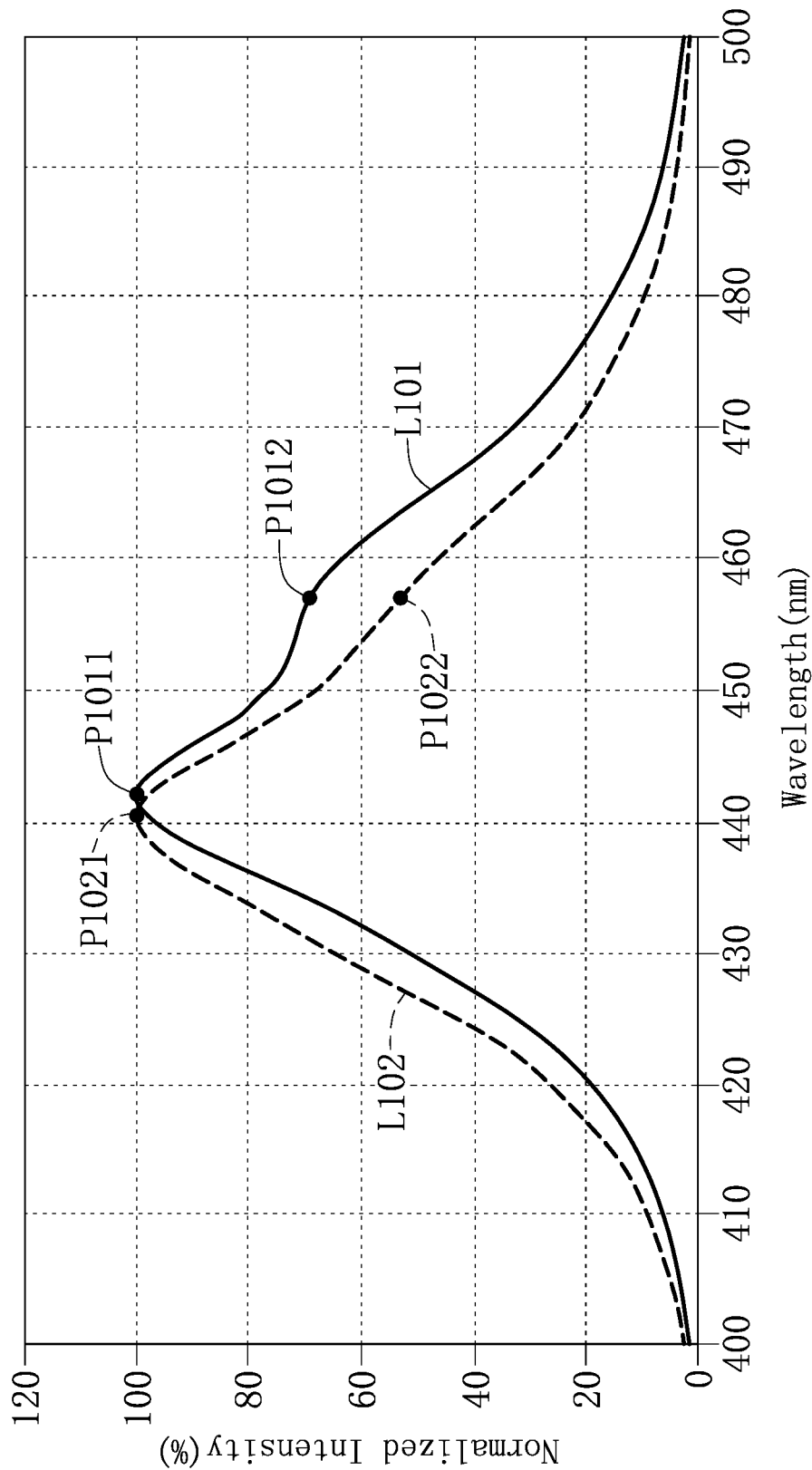
FIG. 10 shows broadband blue spectrums of a light-emitting diode according to an embodiment of the present disclosure under different operating current densities.

Reference is made to FIG. 10. FIG. 10 shows broadband blue spectrums of a light-emitting diode under different operating current densities according to an embodiment of the present disclosure. The light-emitting stack 32 of the light-emitting diode of FIG. 10 may have an energy band structure shown in FIG. 7.

The curves L101, L102 represent the spectrum waveforms of the light-emitting diode that is measured under 25° C. However, the curve L101 represents the spectrum waveform of the light-emitting diode operating under a driving current of 60 mA (operating current density of 120 mA/mm$^2$), and the curve L102 represents the spectrum waveform of the light-emitting diode operating under a driving current of 150 mA (operating current density of 300 mA/mm$^2$).

It should be noted that since the chip sizes of the light-emitting diodes used to be tested are the same, the curve L101 represents a spectrum waveform of the light-emitting diode measured under a lower operating current density, and the curve L102 represents a spectrum waveform of the light-emitting diode measured under a higher operating current density.

Furthermore, in the present embodiment, the chip size of the light-emitting diode is 26×30 mil$^2$, and hence, the curve L101 is a spectrum waveform of the light-emitting diode measured under an operating current density of 120 mA/mm$^2$, and the curve L102 is a spectrum waveform of the light-emitting diode measured under an operating current density of 300 mA/mm$^2$.

As shown in FIG. 10, the spectrum waveform L101 and the spectrum waveform L102 each has a main peak in the middle wavelength range (about from 435 nm to 445 nm), and the two main peaks have the main peak points P1011, P1021 respectively. In the long wavelength range (about from 450 nm to 460 nm), the spectrum waveform L101 and the spectrum waveform L102 each has a shoulder peak and each has a relative maximum value or an inflection point P1012, P1022. In the present embodiment, the intensity of the main peak point P1011 of the spectrum waveform L101 is defined as 100% to normalize the spectrum waveform L101, and the intensity of the main peak point P1021 of the spectrum waveform L102 is defined as 100% so as to normalize the spectrum waveform L102.

Furthermore, in the present embodiment, the main peaks of the spectrum waveforms L101, L102 correspond to the second sub-light beams L2 generated by the second well layers 321b, and the shoulder peak located at the right side of the main peak can correspond to the first sub-light beams L1 generated by the first well layers 321a.

As shown in FIG. 10, the FWHM of the spectrum waveform L101 is greater than the FWHM of the spectrum waveform L102. In other words, in the present embodiment, the FWHM of the spectrum waveform of the light beam generated by the light-emitting diode increases as the driving current (or the operating current density) decreases. Moreover, as the driving current decreases, the spectrum waveform measured from the chip of the light-emitting diode of the present embodiment shifts towards long wavelength side, i.e., shows the phenomenon of red shift.

In addition, the intensity of the relative maximum value or the inflection point P1012 in the spectrum waveform L101 is higher than the intensity of the relative maximum value or the inflection point P1022 in the spectrum waveform L102. In other words, as the driving current (or the operating current density) increases, the relative intensity of the first sub-light beam L1 with the longer wavelength generated by the first well layer 321a becomes lower.

Accordingly, in the embodiments of the present disclosure, when the operating current density of the light-emitting diode is changed within a range from 100 mA/mm$^2$ to 300 mA/mm$^2$, the ratio of the first luminous intensity of the first sub-light beam L1 to the second luminous intensity of the second sub-light beam L2 would vary within a range from 0.1 to 0.9 in accordance with the operating current density.

Figure 11:
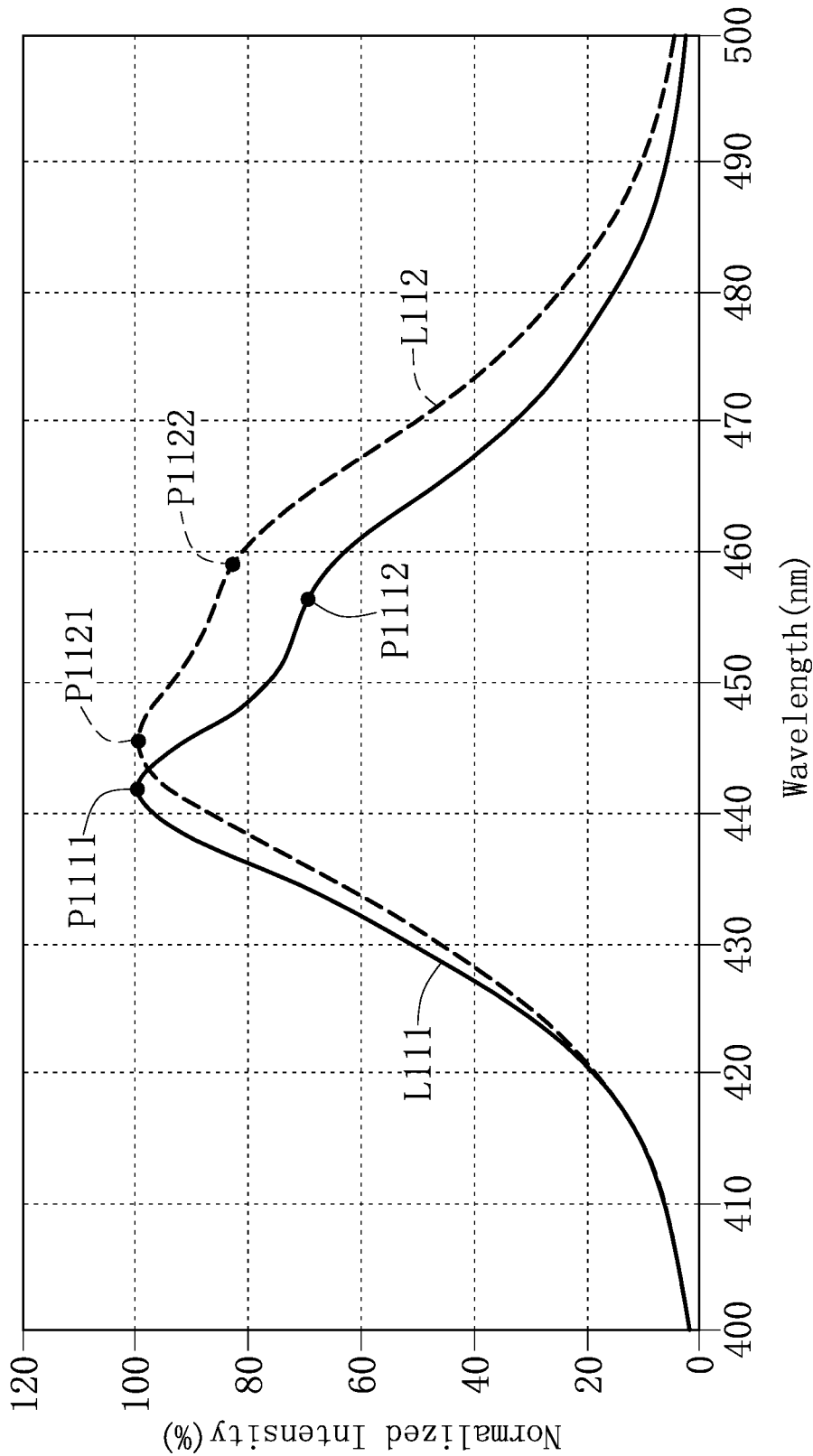
FIG. 11 shows broadband blue spectrums of a light-emitting diode according to an embodiment of the present disclosure under different operating temperatures.

Reference is made to FIG. 11. FIG. 11 is a broadband blue spectrum of the light-emitting diode of an embodiment of the present disclosure under different operating temperatures. The light-emitting stack 32 of the light-emitting diode of FIG. 11 may have an energy band structure shown in FIG. 7.

The curves L111, L112 are both the spectrum waveforms of the light-emitting diode operating under a driving current of 60 mA, while the curve L111 represents the spectrum waveform that is measured under the operating temperature of 25° C., and the curve L112 represents the spectrum waveform that is measured under the operating temperature of 85° C.

As shown in FIG. 11, the spectrum waveform L111 and the spectrum waveform L112 each has a main peak in the middle wavelength range (about from 440 nm to 450 nm), and the two main peaks have main peak points P1111, P1121, respectively. In the long wavelength range (about from 450 nm to 460 nm), the spectrum waveform L111 and the spectrum waveform L112 each has a shoulder peak which has a relative maximum value or an inflection point P1112, P1122. In the present embodiment, the intensity of the main peak point P1111 of the spectrum waveform L111 is defined as 100% for normalizing the spectrum waveform L111, and the intensity of the main peak point P1121 of the spectrum waveform L112 is defined as 100% for normalizing the spectrum waveform L112.

Furthermore, in the present embodiment, the main peaks of the spectrum waveform L111, L112 correspond to the second sub-light beams L2 generated by the second well layers 321b, and the shoulder peak located at the right side of the main peak corresponds to the first sub-light beams L1 generated by the first well layers 321a.

As shown in FIG. 11, the FWHM of the spectrum waveform L112 is greater than that of the spectrum waveform L111. In other words, under the same applied driving current, the FWHM of the spectrum waveform of the light-emitting diode of the present embodiment increases as the operating temperature increases.

In addition, the intensity corresponding to the relative maximum value of the inflection point P1122 of the spectrum waveform L112 is higher than the intensity corresponding to the relative maximum value of the inflection point P1112 of the spectrum waveform L111. In other words, when the operating temperature increases, the relative intensity of the first sub-light beam L1 with a longer wavelength generated by the first well layer 321a is higher.

Therefore, in the embodiments of the present disclosure, when the operating temperature of the light-emitting diode is changed in a range from 25° C. to 85° C., the ratio of the first luminous intensity of the first sub-light beam L1 to the second luminous intensity of the second sub-light beam L2 varies in a range from 0.1 to 0.9 as the operating temperature varies.

Figure 12:
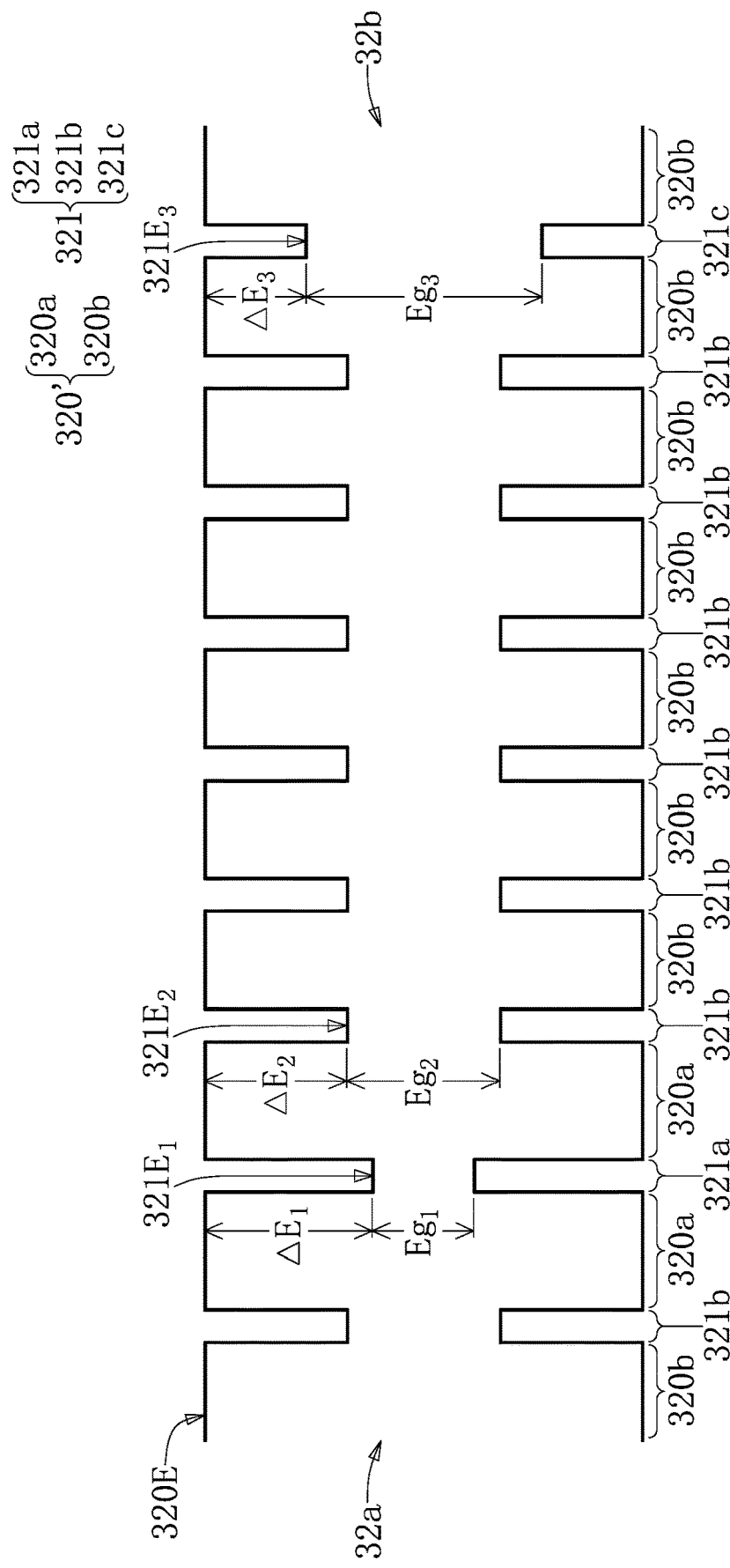
FIG. 12 is a schematic view of an energy band structure of a light-emitting stack according to a fourth embodiment of the present disclosure.

Reference is made to FIG. 12. FIG. 12 is a schematic view of the energy band structure of the light-emitting stack according to the fourth embodiment of the present disclosure. The elements in the present embodiment that are the same as or similar to those shown in FIG. 7 are designated to the same reference numeral.

Similar to the third embodiment, in the present embodiment, the barrier layers 320' includes at least two first barrier layers 320a and at least a second barrier layer 320b (a plurality of second barrier layer 320b are illustrated in FIG. 12). The two first barrier layers 320a are located at the two opposite sides of one of the first well layers 321a. That is, one of the first well layers 321a is sandwiched between the two first barrier layers 321a. The thickness T1 of the first barrier layer 320a is greater than or equal to the thickness T2 of the second barrier layer 320b.

Moreover, in the embodiment of FIG. 12, the well layer 321 that is closest to the P-type semiconductor layer 31 (the second side 32b) is a third well layer 321c, but both of the well layers 321 that are the second and third closest to the P-type semiconductor layer 31 are the second well layers 321b.

Figure 13:
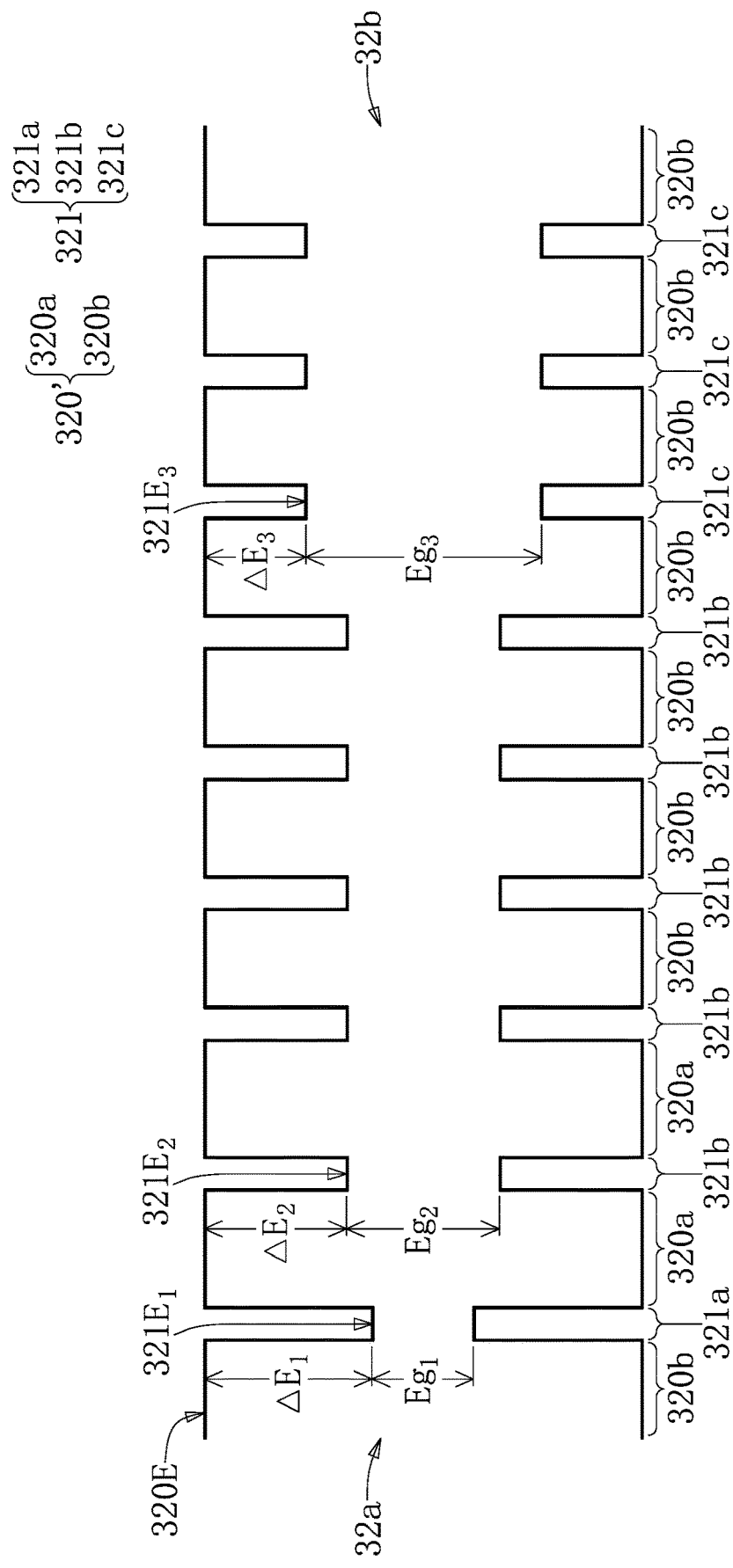
FIG. 13 is a schematic view of an energy band structure of a light-emitting stack according to a fifth embodiment of the present disclosure.

Reference is made to FIG. 13. FIG. 13 is a schematic view of the forbidden band structure of the light-emitting stack of the fifth embodiment of the present disclosure. The elements in the present embodiment that are the same as those shown in FIG. 7 are designated to the same reference numeral.

Compared to the third embodiment shown in FIG. 7, in the present embodiment, the well layer 321 that is closest to the N-type semiconductor layer 30 (the first side 32a) is a first well layer 321a, and the well layer 321 that is the second closest to the N-type semiconductor layer 30 is a second well layer 321b. In another embodiment, both of the well layers 321 that are closest and the second closest to the first side 32a are second well layers 321b, and the well layer 321 that is the third closest to the first side 32a is a first well layer 321a.

In other words, as shown in the embodiments of FIG. 7, FIG. 12 and FIG. 13, at least one of the three well layers 321 that are closest to the N-type semiconductor layer 30 is a first well layer 321a.

In addition, in the present embodiment, the barrier layers 320' also includes at least two first barrier layers 320a and at least a second barrier layer 320b (FIG. 11 depicts a plurality of second barrier layers 320b). The thickness T1 of the first barrier layer 320a is greater than or equal to the thickness T2 of the second barrier layer 320b.

In the present embodiment, at least a first barrier layer 321a is connected between two second well layers 321b. In addition, the well layers 321 includes only one first well layer 321a, and one of the first barrier layer 320a is located between the first well layer 321a and one of the second well layers 321b.

Figure 14:
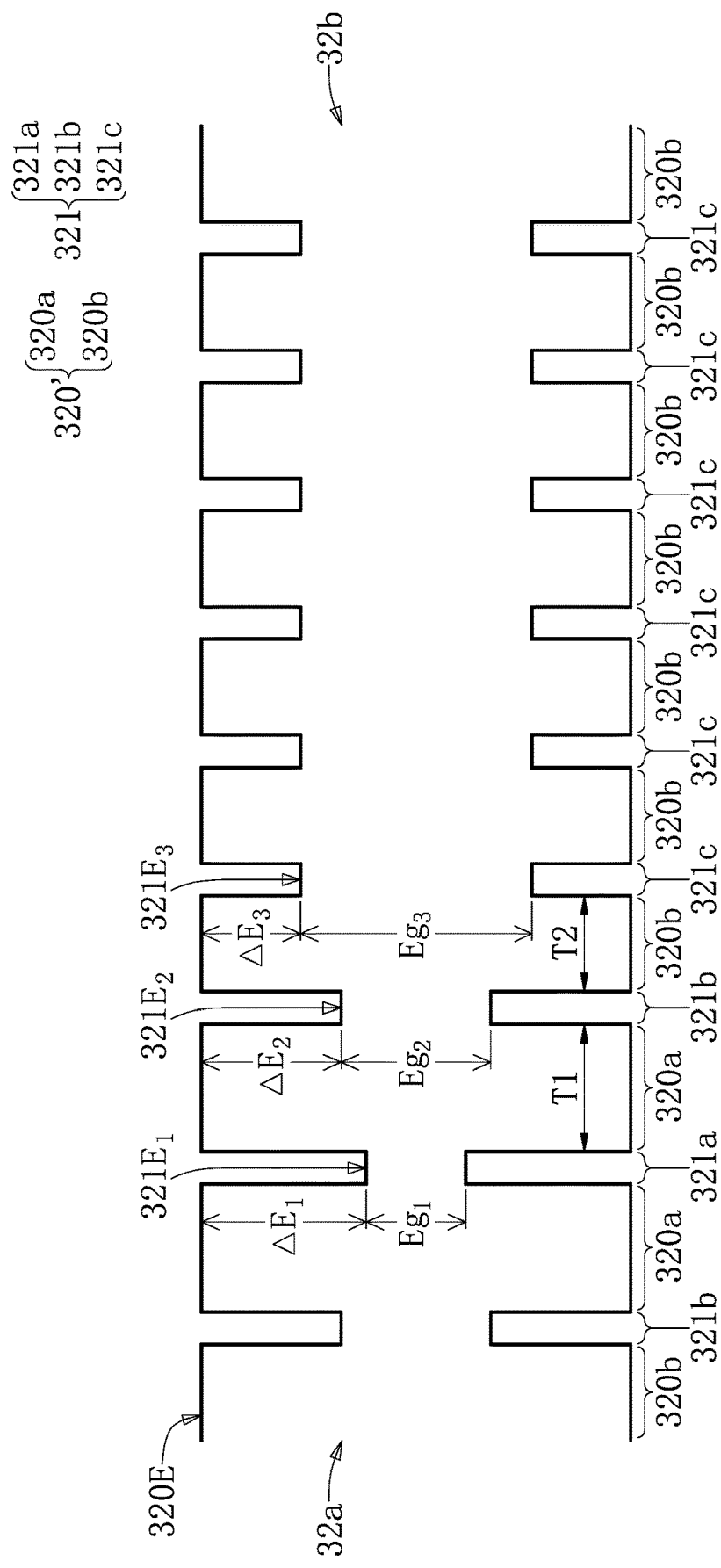
FIG. 14 is a schematic view of an energy band structure of a light-emitting stack according to a sixth embodiment of the present disclosure.

Reference is made to FIG. 14. FIG. 14 is a schematic view of the energy band structure of the light-emitting stack of the sixth embodiment of the present disclosure. The elements in the present embodiment that are the same as those shown in FIG. 7 are designated to the same reference numeral.

Similar to the third embodiment, in the present embodiment, the barrier layers 320' includes at least two first barrier layers 320a and at least a second barrier layer 320b (FIG. 14 depicts a plurality of second barrier layers 320b). The two first barrier layers 320a are located at the two opposite sides of one of the first well layers 321a. In other words, one of the first well layers 321a is sandwiched between two first barrier layers 320a. The thickness T1 of the first barrier layer 321a is larger than or equal to the thickness T2 of the second barrier layer 320b.

Furthermore, the thickness T1 of the first barrier layers 320a is 1 to 1.5 times the thickness T2 of the second barrier layer 320b; preferably, the thickness T1 of the first barrier layers 320a is 1.2 to 1.5 times the thickness T2 of the second barrier layer 320b.

Only the thickness of the first barrier layer 320a that is connected to the first well layer 321a is 2.5 to 5 times the thickness of the well layer 321, and the thickness of the second barrier layers 320b is still 2 to 3.5 times the thickness of the well layer 321. In other words, it is not necessary for every barrier layer 320 to increase the thickness thereof, such that the thickness is 2.5 to 5 times the thickness of the well layer. Compared to the conventional technique, only the two first barrier layers 321a that are connected to the first well layer 321a are thickened, an effect on the spectrum waveform of the light-emitting stack 32 resulting from a variation of the operating current can be attenuated.

In addition, in the embodiment of FIG. 14, the six well layers 321 closest to the second side 32b (the side close to the P-type semiconductor layer 31) are the third well layers 321c.

Figure 15:
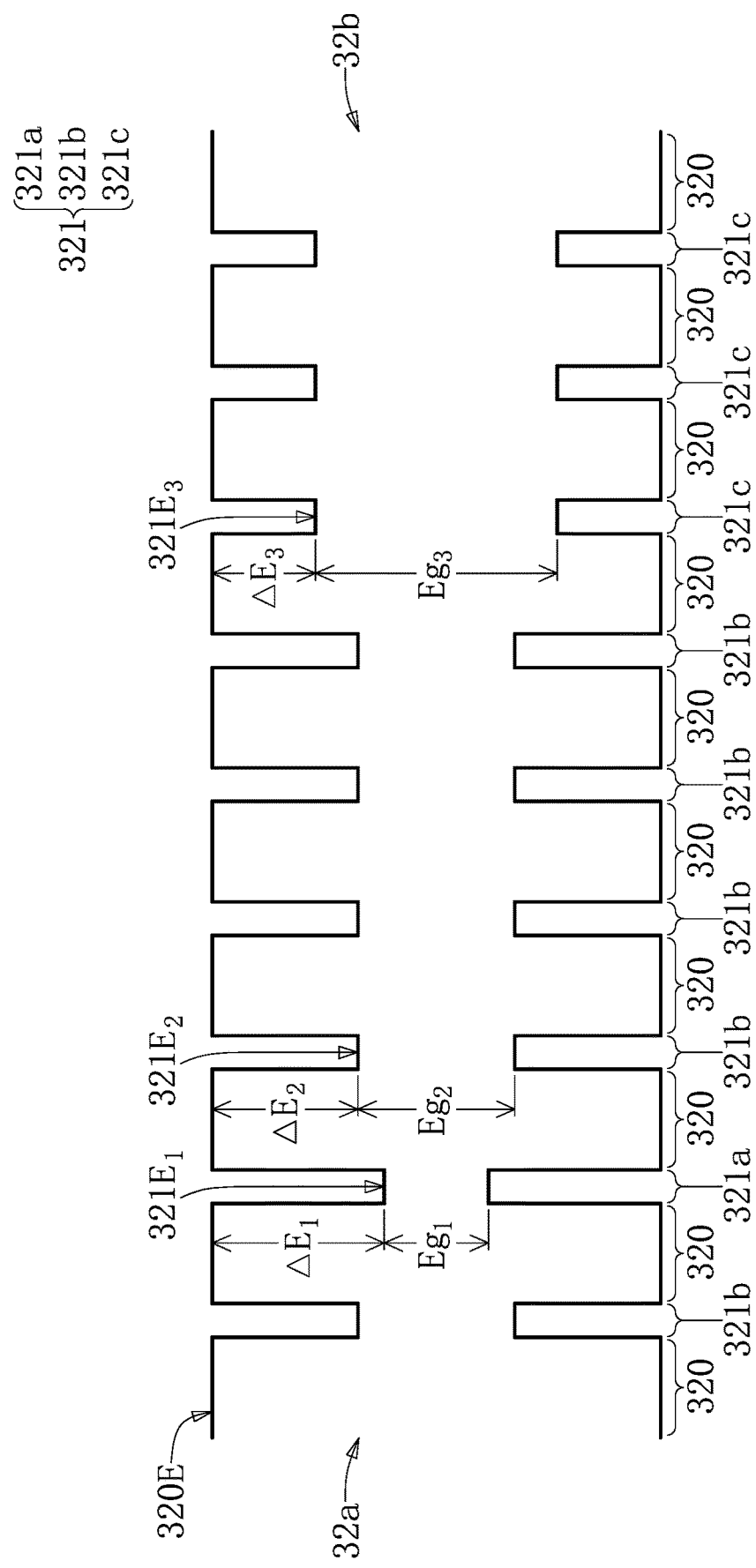
FIG. 15 is a schematic view of an energy band structure of a light-emitting stack according to a seventh embodiment of the present disclosure.

Reference is made to FIG. 15. FIG. 15 is the schematic view of the energy band structure of the light-emitting stack of the seventh embodiment of the present disclosure. The numbers and the arrangements of the first well layers 321a, the second well layers 321b and the third well layers 321c are the same as the (third) embodiment shown in FIG. 7. In other words, the number of the second well layers 321b is greater than the number of the first well layers 321 and the number of the third well layer 321c in the present embodiment.

In addition, in the present embodiment, the three well layers 321 that are closest to the second side 32b (the side closer to the P-type semiconductor layer 31) are the third well layers 321c, and the well layer 321 that is the second closest to the first side 32a (the side closer to the N-type semiconductor layer 30) is a first well layer 321a. In addition, all of other well layers 321 located at the middle section of the light-emitting stack 32 are the second well layers 321b. In the present embodiment, the well layers 321 located at the middle section of the light-emitting stack 32 are all second well layers 321b, such that the stability of the yield can be improved.

One of the differences between the present embodiment and the third embodiment shown in FIG. 7 is that the barrier layers 320 of the present embodiment have a substantially the same thickness.

In addition, it should be mentioned that although in the embodiments of the present disclosure, there is only one well layer 321a, the present disclosure is not limited thereto. In another embodiment, the number of the first well layer 321a can be more than one. As long as the well layer 321 that is the second or third closet to N-type semiconductor layer 31 is the first well layer 321a, and the intensity of the first sub-light beam L1 is not too low or too high to affect the white light spectrum, the number of the first well layer 321a is not limited in the present disclosure.

Figure 16:
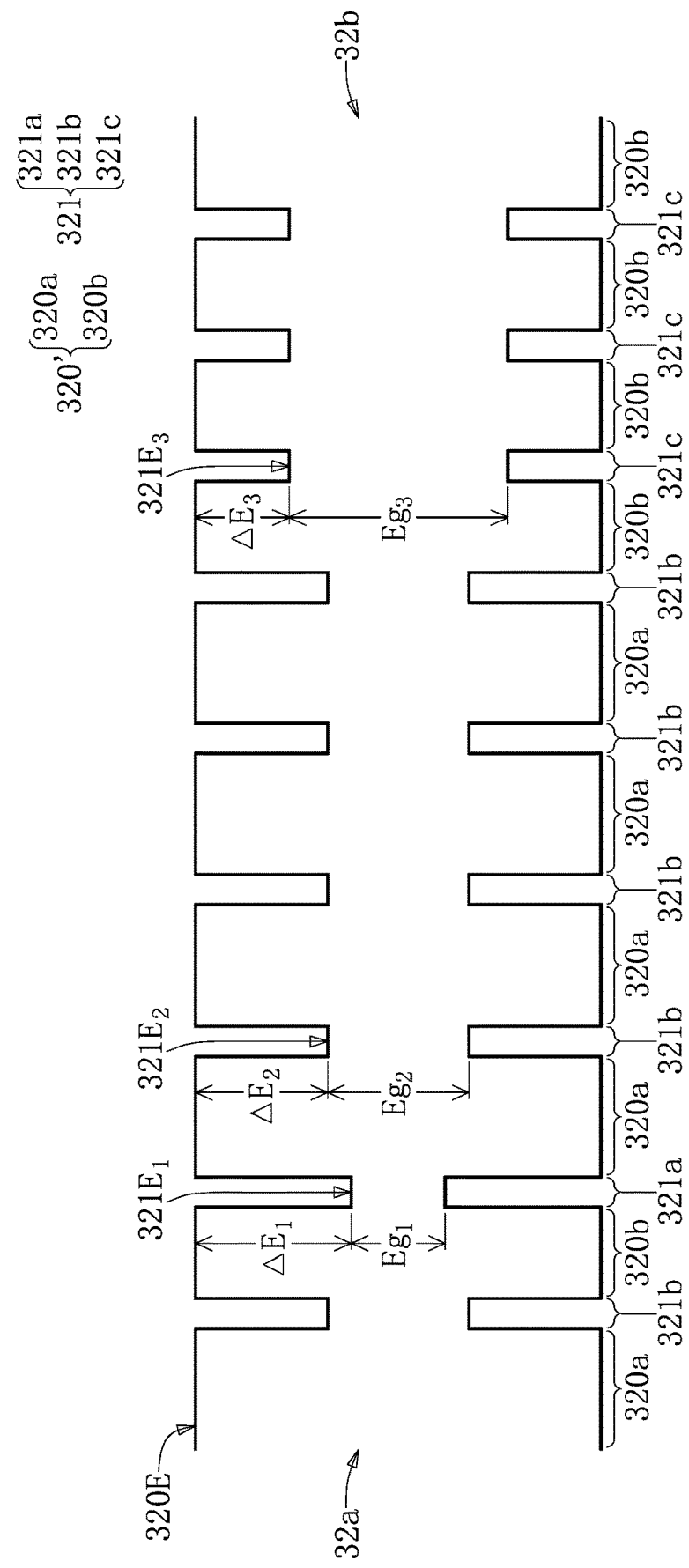
FIG. 16 is a schematic view of an energy band structure of a light-emitting stack according to an eighth embodiment of the present disclosure.

Reference is made to FIG. 16. FIG. 16 is the schematic view of the energy band structure of the light-emitting stack of the eighth embodiment of the present disclosure. In the present embodiment, the barrier layers 320' includes at least two first barrier layer 320a and at least a second barrier layer 320b (FIG. 16 depicts a plurality of second barrier layer 320b). The thickness T1 of the first barrier layer 320a is greater than the thickness T2 of the second barrier layer 320b.

Furthermore, the thickness T1 of the first barrier layers 320a is 1 to 1.5 times the thickness T2 of the second barrier layer 320b; preferably, the thickness T1 of the first barrier layers 320a is 1.2 to 1.5 times the thickness T2 of the second barrier layer 320b. The thickness T1 of the first barrier layers 320a is 2.5 to 5 times the thickness of the well layer 321, and the thickness T2 of the other second barrier layers 320b is still 2 to 3.5 times the thickness of the well layer 321.

One of the differences between the present embodiment and the embodiment shown in FIG. 7 (the third embodiment) is that at least one of the two barrier layers 320' that are connected to the second well layer 321b is a first barrier layer 320a. In the present embodiment, at least two first barrier layers 320a are located at the two opposite sides of one of the second well layers 321b. In other words, one of the second well layers 321a is sandwiched between two first barrier layers 320a. The thickness T1 of the first barrier layers 320a is greater than or equal to the thickness T2 of the second barrier layer 320b.

It should be mentioned that if both of the two barrier layers 320' connected to the second well layer 321b are the thicker first barrier layers 320a, the ratio of intensity in the long wavelength range (about from 460 nm to 480 nm) to the intensity in the middle wavelength range (about from 440 nm to 450 nm) in the broadband blue spectrum will vary.

Figure 17:
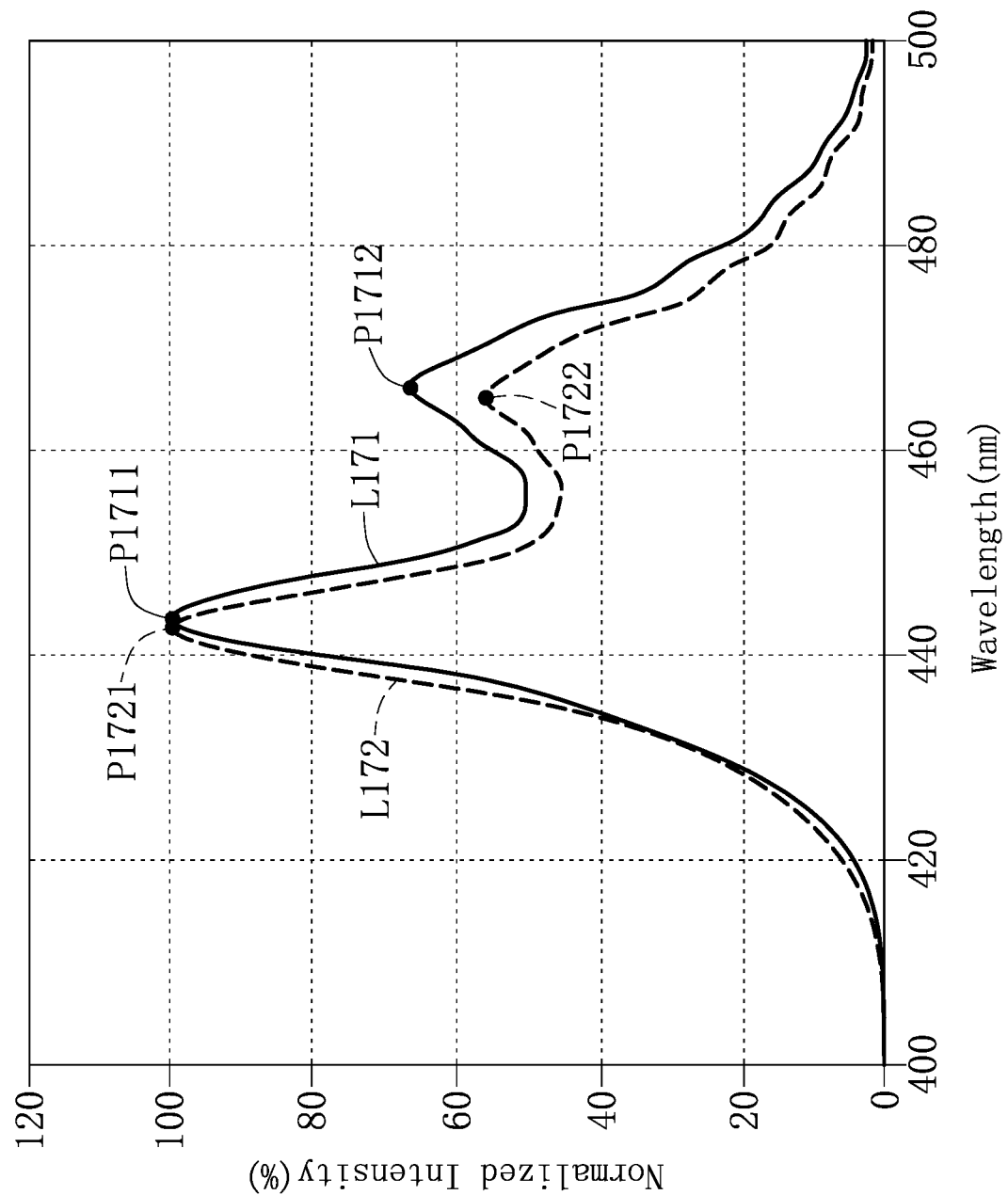
FIG. 17 is the broadband blue spectrums of light-emitting diodes according to the seventh and eighth embodiments of the present disclosure.

Reference is made to FIG. 17. FIG. 17 shows the broadband blue spectrums of the light-emitting diodes of the seventh and eighth embodiments of the present embodiment. As shown in FIG. 17, the curve L171 represents the spectrum waveform of the light-emitting diode of the seventh embodiment of the present disclosure, and the curve L172 represents the spectrum waveform of the light-emitting diode of the eighth embodiment of the present disclosure. It should be noted that in the seventh embodiment (shown in FIG. 15), all the barrier layers 320 have the same thickness.

The spectrum waveform L171 of the seventh embodiment and the spectrum waveform L172 of the eighth embodiment both have a main peak within the middle wavelength range (about from 440 nm to 450 nm), and a shoulder peak within the long wavelength range (about from 460 nm to 480 nm).

The main peak of the spectrum waveform L171 of the seventh embodiment has a main peak point P1711, and the main peak of the spectrum waveform L172 has a main peak point P1721. In addition, the shoulder peak of the spectrum waveform L171 of the seventh embodiment within the long wavelength range (about from 460 nm to 480 nm) has a relative maximum value or an inflection point P1712. The shoulder peak of the spectrum waveform L172 of the eighth embodiment within the long wavelength range (about 460 nm to 480 nm) has a relative maximum value or an inflection point P1722.

In the present embodiment, the intensity of the main peak point P1711 of the spectrum waveform L171 is defined as 100% for normalizing the spectrum of the light-emitting diode of the seventh embodiment. In addition, the intensity of the main peak point P1721 of the spectrum waveform L172 is defined as 100% for normalizing the spectrum of the light-emitting diode of the eighth embodiment.

As shown in FIG. 17, if each of the barrier layers 320 located at two opposite sides of the second well layer 321b is replaced with a thicker first barrier layer 320a, the intensity of the relative maximum value or the inflection point P1722 of the spectrum waveform L172 will be lower than the intensity of the relative maximum value or the inflection point P1712 of the spectrum waveform L171. That is to say, when the barrier layers 320' at the both sides of the second well layer 321b are thicker, the intensity within the long wavelength range in the spectrum of the light beam generated by the light emitting layer 32 is relatively weaker. Therefore, the spectrum waveform can be adjusted by changing the thicknesses of the barrier layers 320'.

Figure 18:
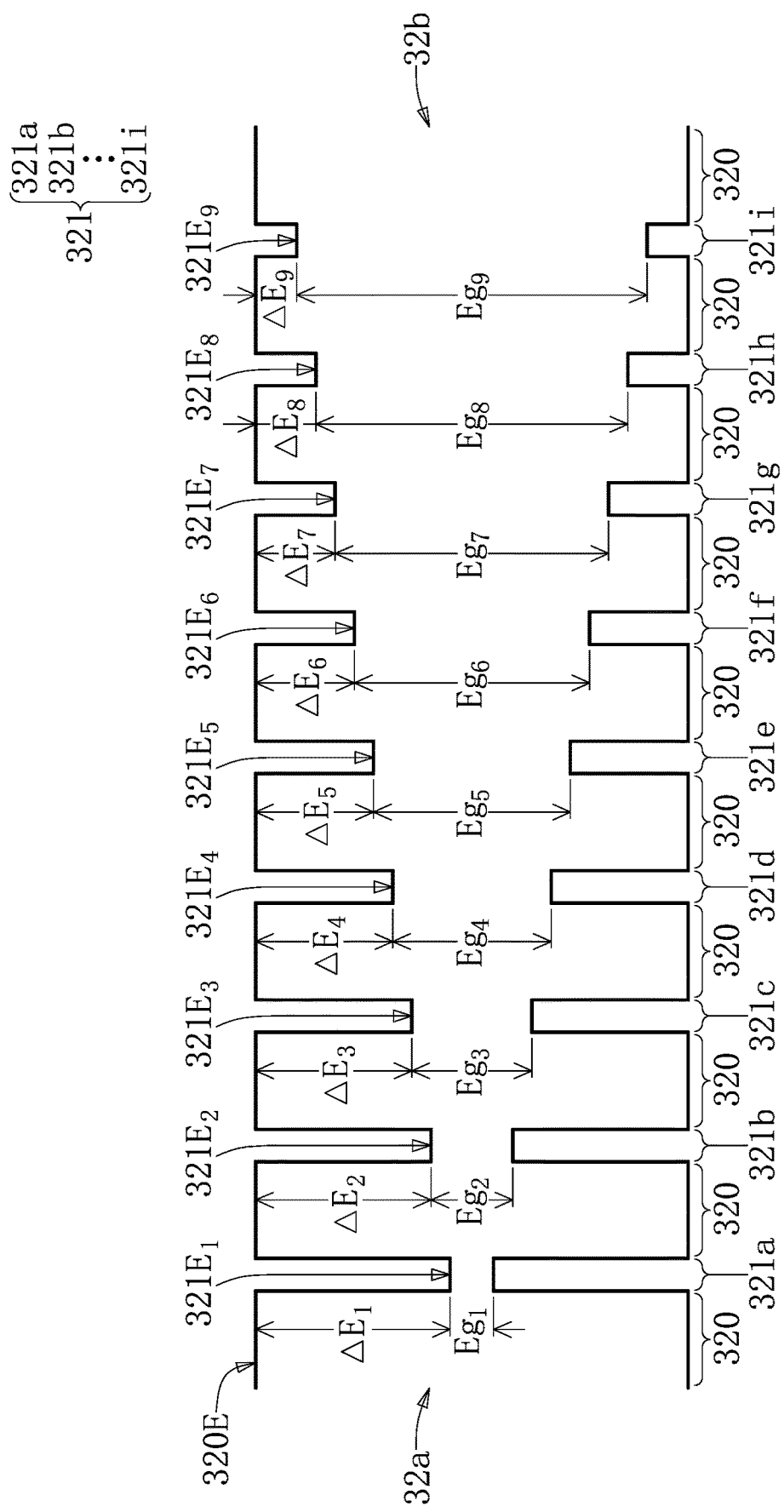
FIG. 18 is a schematic view of an energy band structure of a light-emitting stack according to a ninth embodiment of the present disclosure.

Reference is made to FIG. 18. FIG. 18 is a schematic view of the energy band structure of the light-emitting stack of the ninth embodiment of the present disclosure. In the present embodiment, the barrier layer 320 is a gallium nitride (GaN) layer, and the material of the well layers 321 includes indium gallium nitride, and the indium gallium nitride has a general formula of $In_xGa_{(1-x)}N$, wherein x ranges from 0.12 to 0.2. As mentioned above, the indium concentration in the well layers 321 affects the energy band gaps of the well layer 321. Therefore, the energy band gaps of the well layers 321 can be adjusted by controlling the indium concentration in each of the well layers, so as to control the wavelength of the sub-light beam generated by the well layer 321.

In the present embodiment, the well layers 321a~321i have different indium concentrations, respectively. The well layer (such as the first well layer 321a) that is closer to the N-type semiconductor layer 30 (the first side 32a) has an indium concentration larger than that of the well layer (such as the well layer 321i) that is farther away from the N-type semiconductor layer 30 (the first side 32a). Any two of the well layers (such as the well layers 321a, 321b) that are nearest to each other have a difference of at least 0.5% in indium concentration therebetween, such that an indium concentration gradient is formed in the multiple quantum well structure of the light-emitting stack 32.

Reference is made to Table 2 and FIG. 18 which show the indium concentration (%) of the plurality of well layers 321a~321i of the present embodiment and the wavelength of the plurality of sub-light beams generated from the well layers 321a~321i.

TABLE 2

| | well layer | | | | | | | | |
|---|---|---|---|---|---|---|---|---|---|
| | 321a | 321b | 321c | 321d | 321e | 321f | 321g | 321h | 321i |
| wavelength (nm) | 464 | 458 | 452 | 446 | 440 | 434 | 428 | 422 | 416 |
| Indium concentration (%) | 18 | 17 | 16 | 15 | 14 | 13 | 12 | 11 | 10 |

The lower the indium concentration, the larger the energy band gaps of the well layers 321a~321i, and the shorter the wavelengths of the sun-light beams generated therefrom. Based on Table 2, in the light-emitting stack 32 of the present embodiment, the indium concentration of the plurality of well layers 321a~321i decreases from the N-type semiconductor layer 30 (the first side 32a) toward the P-type semiconductor layer 31 (the second side 32b).

The indium concentration in each of the well layers 321a~321i is related to the growth temperature of the well layers 321a~321i. The higher the growth temperature of the well layers 321a~321i is, the lower the indium concentration is. Therefore, by forming the well layers 321a~321i under different growth temperatures, the well layers 321a~321i can have different energy band gaps $Eg_1$~$Eg_9$. In the present embodiment, the energy band gaps $Eg_1$~$Eg_9$ of the well layers 321a~321i increase along a direction from the first side 32a to the second side 32b. Therefore, any two sub-light beams generated by two of the well layers (such as well layer 321a, 321b) that are nearest to each other have a difference of at least 1 nm in wavelength therebetween. The well layer that is closest to the P-type semiconductor layer 31 (such as the well layer 321i) is used to generate a sub-light beam with a shortest wavelength.

Based on the description above, a light beam formed by mixing the sub-light beams respectively generated by the well layers 321a~321i can have a broadband blue spectrum.

Figure 19:
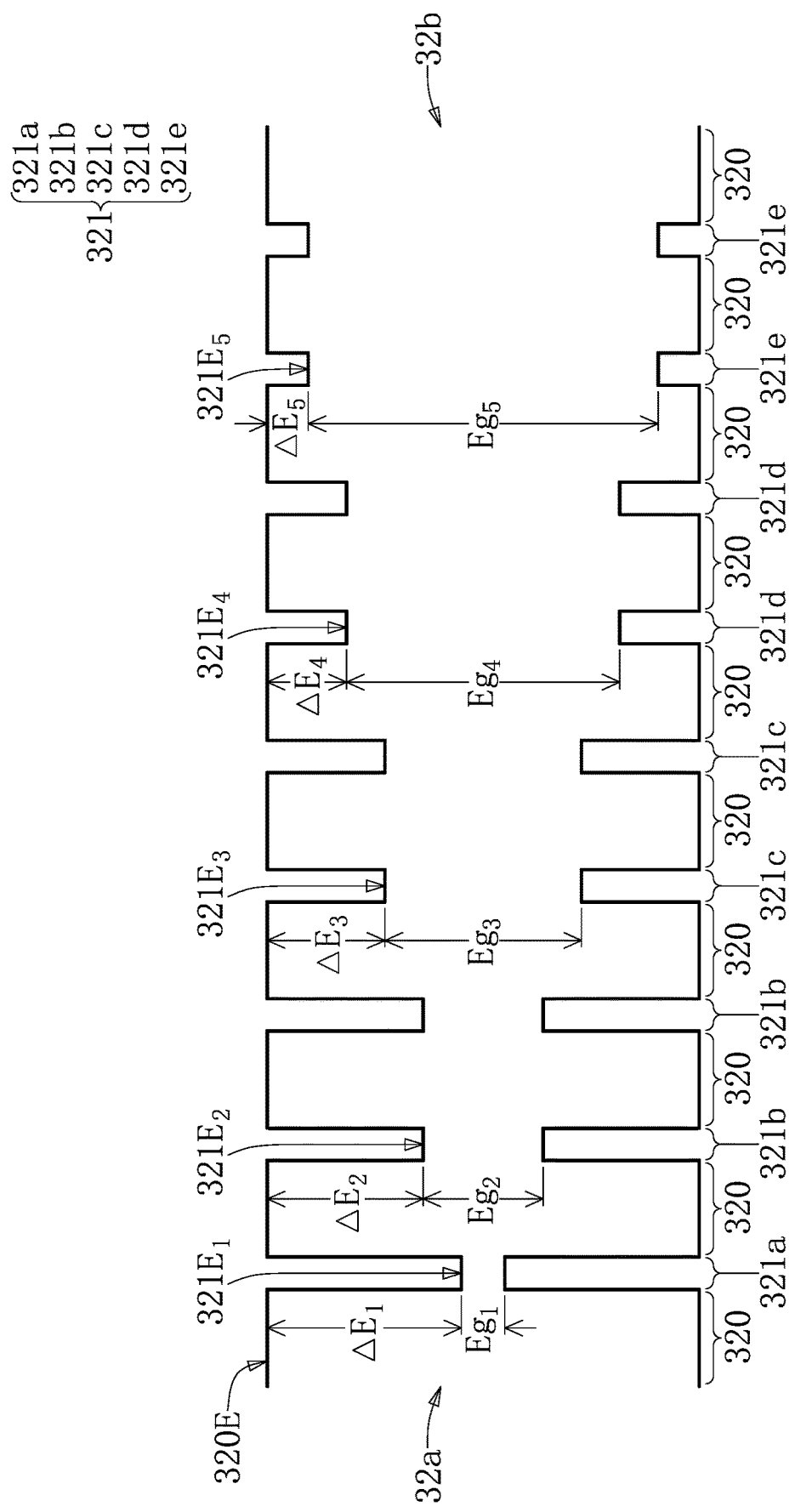
FIG. 19 is a schematic view of an energy band structure of a light-emitting stack according to a tenth embodiment of the present disclosure.

Reference is made to FIG. 19. FIG. 19 is a schematic view of the energy band structure of the light-emitting stack of the tenth embodiment of the present disclosure. In the present embodiment, the well layer 321 (such as the first well layer 321a) that is closest to the N-type semiconductor layer 30 (the first side 32a) can have an indium concentration greater than that of the well layer 321 (such as the fifth well layer 321e) that is the farthest away from the N-type semiconductor layer 30 (the first side 32a). Therefore, the energy band gap $Eg_1$ of the well layer 321a that is closest to the first side 32a is narrowest and the energy band gap $Eg_5$ of the well layer 321e that is farthest away from the first side (i.e., closest to the second side 32b) is the widest.

To be more specific, in the well layers 321 of the present embodiment, the first well layer 321a that is closest to the first side 32a has a first indium concentration, the two second well layers 321b that are the second and third closest to the first side 32a both have a same second indium concentration, and the two third well layers 321c that are the fourth and fifth closest to the first side 32a both have a same third indium concentration. The two fourth well layers 321d that are sixth and seventh closest to the first side 32a both have a same fourth indium concentration, and the two fifth well layers 321e that are closest to the second side 32b both have a same fifth indium concentration. The first to fifth indium concentrations of the first to fifth well layers 321a~321e are decreases gradually.

In an embodiment, all of the differences between the first and second indium concentrations, the second and third indium concentrations, the third and fourth indium concentrations and the fourth and fifth indium concentration are at least 0.5%.

Compared to the ninth embodiment shown in FIG. 18, in the light-emitting stack 32 of the present embodiment, at least two of the well layers (such as the two second well layers 321b) have the same indium concentration. However, the light beam formed by mixing the sub-light beams generated by the well layers 321 respectively can have a broadband blue spectrum.

Figure 20:
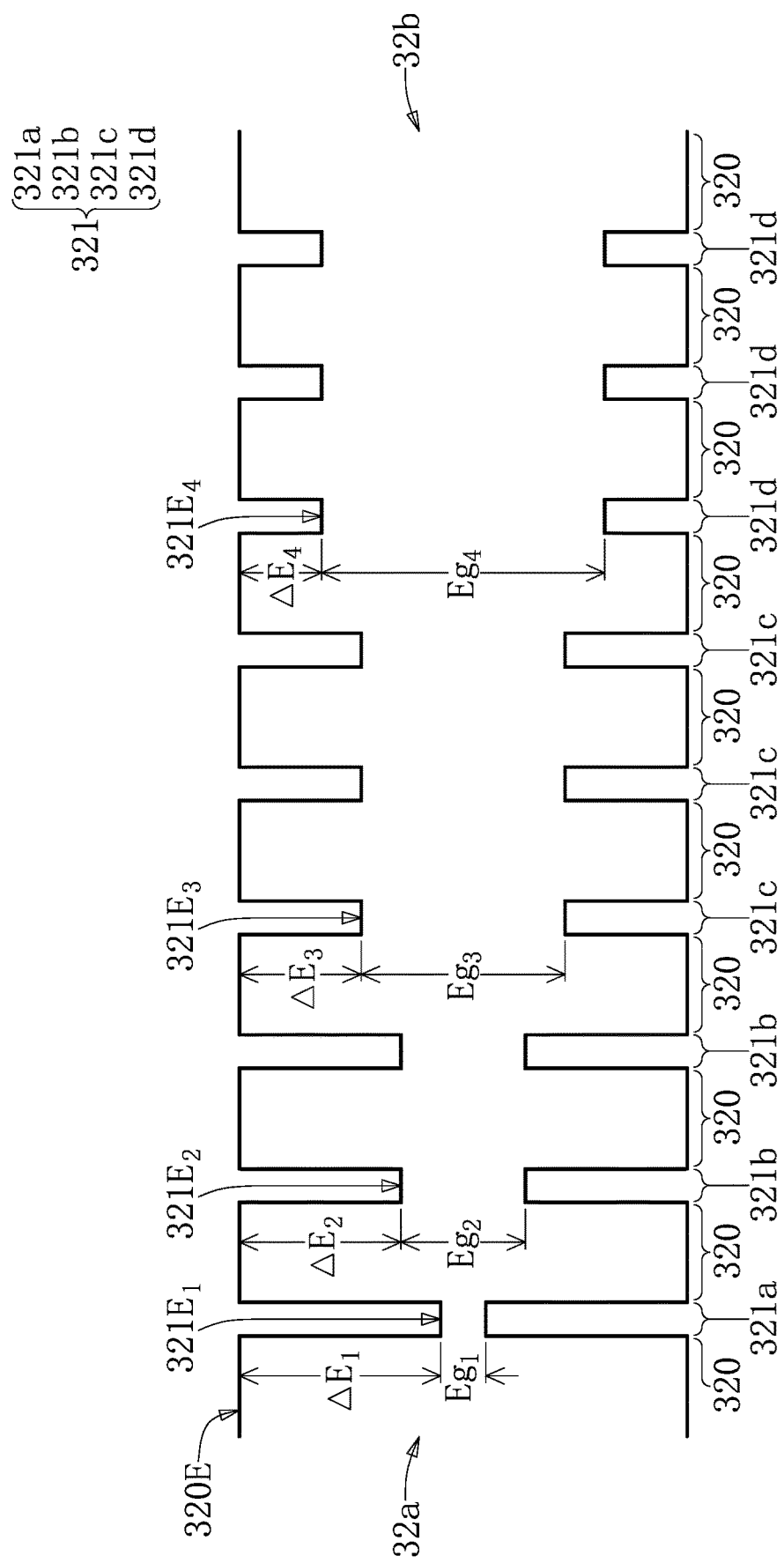
FIG. 20 is a schematic view of an energy band structure of a light-emitting stack according to an eleventh embodiment of the present disclosure.

Reference is made to FIG. 20. FIG. 20 is a schematic view of the energy band structure of the light-emitting stack of the eleventh embodiment of the present disclosure. In the present embodiment, the well layer 321 (such as the first well layer 321a) that is closest to the N-type semiconductor layer 30 (the first side 32) has an indium concentration larger than that of the well layer 321 (such as the fourth well layer 321d) that is farthest away from the N-type semiconductor layer 30 (the first side 32). Therefore, the energy band gap $Eg_1$ of the first well layer 321a that is closest to the first side 32a is narrowest and the energy band gap $Eg_4$ of the well layer 321d that is farthest away from the first side 32a (closest to the second side 32b) is widest.

Furthermore, in the well layers 321 of the present embodiment, the first well layer 321a closest to the first side 32a has a first indium concentration, the two second well layers 321b that are the second and third closest to the first side 32a both have a same second indium concentration, and all the three third well layers 321c that are the fourth to sixth closest to the first side 32a have a same third indium concentration. All of the three fourth well layers 321d that are the seventh to ninth closest to the first side 32a have a same fourth indium concentration. The first to fourth indium concentrations decrease sequentially.

In an embodiment, all of the differences between the first and second indium concentrations, the second and third indium concentrations, and the third and fourth indium concentrations are at least 0.5%.

Compared to the ninth embodiment shown in FIG. 18, in the light-emitting stack 32 of the eleventh embodiment, at least three of the well layers 321 (such as the three third well layers 321c and the three fourth well layers 321d) have the same indium concentration. The light beam formed by mixing the plurality of sub-light beams generated by the well layers 321 respectively can have a broadband blue spectrum.

Figure 21:
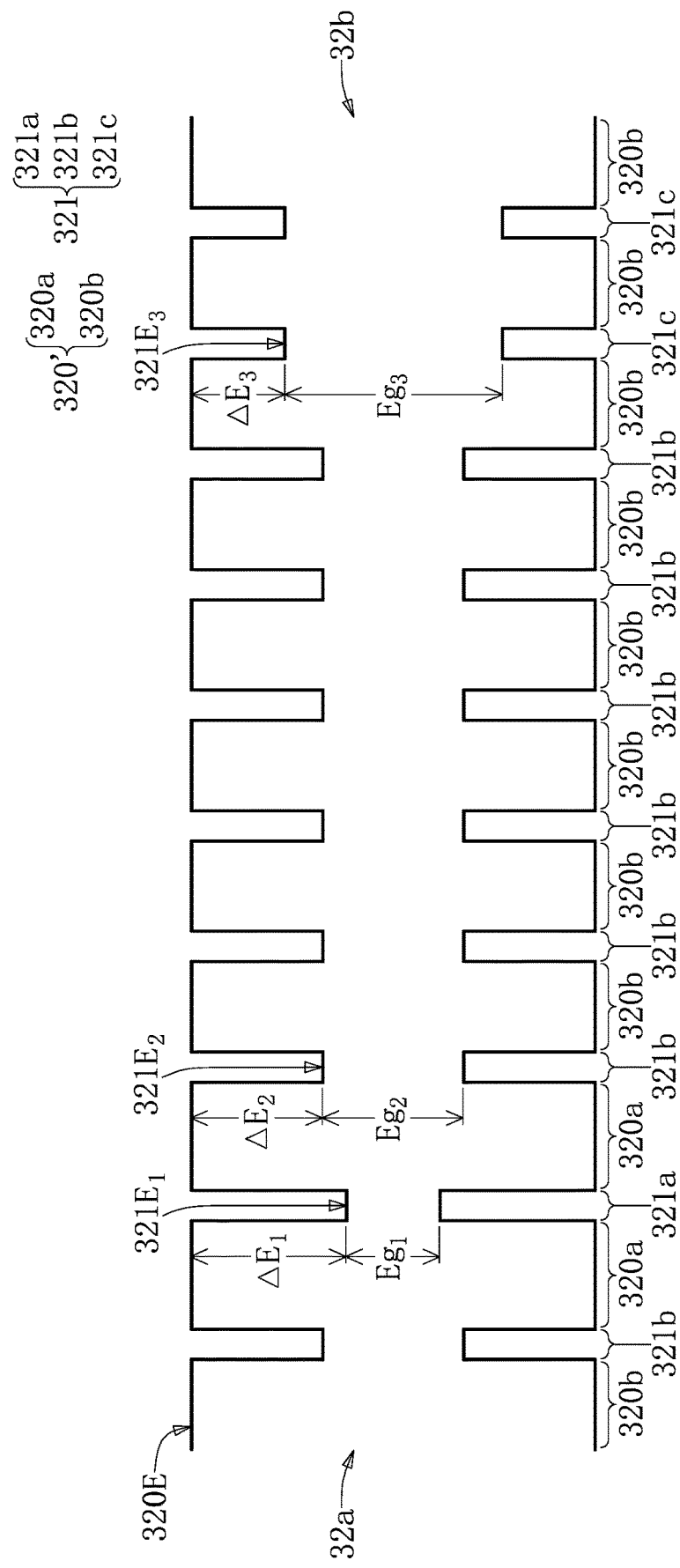
FIG. 21 is a schematic view of an energy band structure of a light-emitting stack according to a twelfth embodiment of the present disclosure.

Reference is made to FIG. 21. FIG. 21 is the schematic view of the energy band structure of the light-emitting stack of the twelfth embodiment of the present disclosure. In the light-emitting stack 32 of the present embodiment, the well layers 321 includes a first well layer 321a, the second well layers 321b and the third well layers 321c. The energy band gap $Eg_3$ of the third well layers 321c is larger than the energy band gap $Eg_2$ of the second well layer 321b, and the energy band gap $Eg_2$ of the second well layer 321b is larger than the energy band gap $Eg_1$ of the first well layer 321a.

In the present embodiment, the well layer 321 closest to the N-type semiconductor layer 30 (the first side 32a) is one of the second well layers 321b, and the well layer 321 that is the second closest to the first side 32a is the first well layer 321a. In addition, all of the three well layers 321 that are closet to the P-type semiconductor layer 31 (the second side 32b) are the third well layers 321c.

In the present embodiment, the first well layers 321a is configured to generate a first sub-light beam L1 having a first wavelength, the second well layers 321b is configured to generate a second sub-light beam L2 having a second wavelength, and the third well layers 321c is configured to generate a third sub-light beam L3 having a third wavelength. The first wavelength, the second wavelength and the third wavelength can be adjusted by adjusting the energy band gaps $Eg_1$, $Eg_2$, $Eg_3$ of the first to third well layers 321a~321c.

Specifically, in an embodiment, the first wavelength is in a range from 470 nm to 490 nm, the second wavelength is in a range from 435 nm to 455 nm, and the third wavelength is in a range from 425 nm to 450 nm.

In addition, the number of the second well layers 321b is largest, and the second luminous intensity of the second sub-light beam L2 generated by the second well layers 321b can be higher than the first luminous intensity of the first sub-light beam L1 generated by the first well layers 321a and larger than the third luminous intensity of the third sub-light beam L3 generated by the third well layers 321c.

Figure 22:
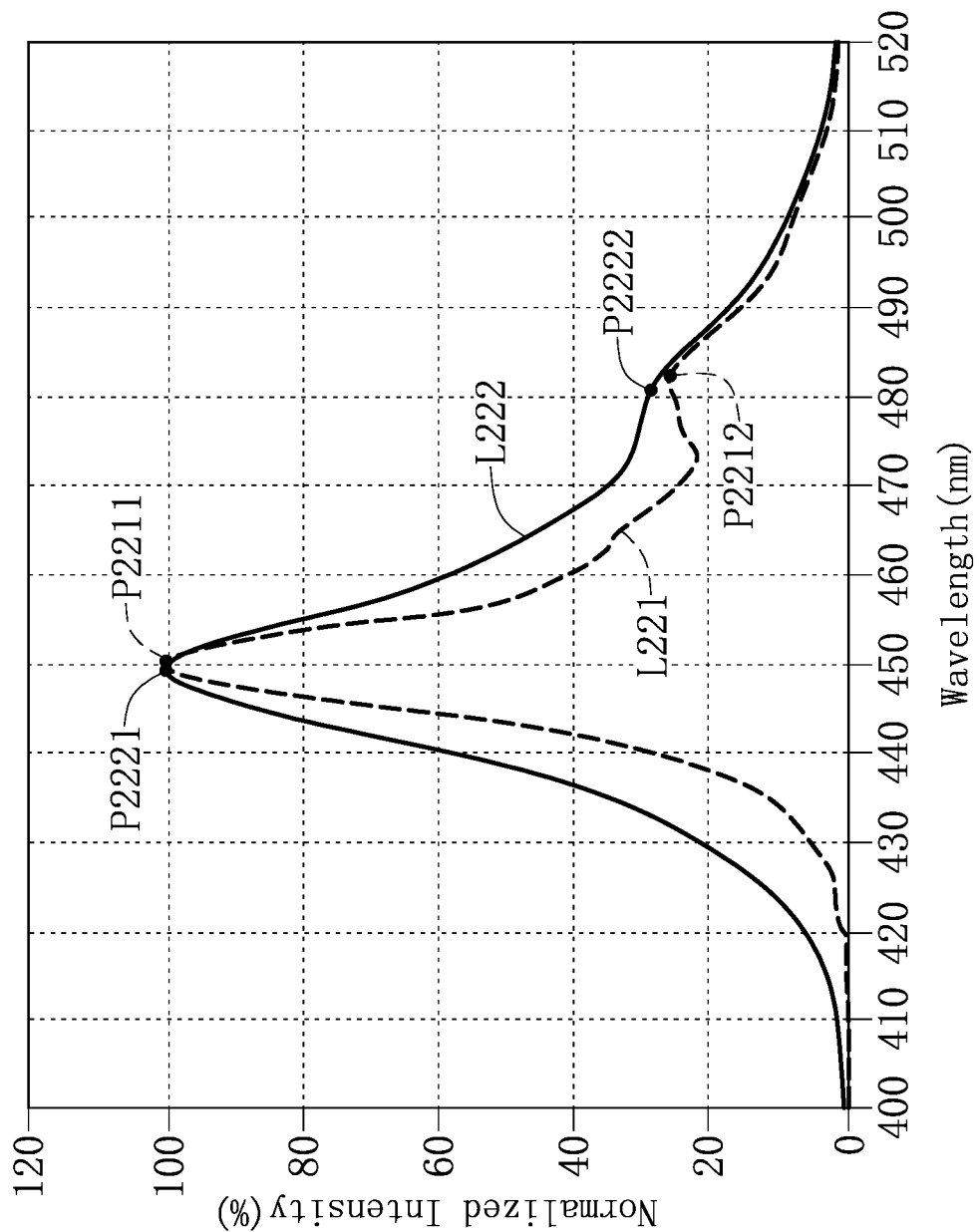
FIG. 22 is a broadband blue spectrum of a light-emitting diode according to the twelfth embodiment of the present disclosure after packaging.

Reference is made to FIG. 22 which is the broadband blue spectrum of the light-emitting diode of the twelfth embodiment of the present disclosure before and after a packaging process. The energy band structure of the light-emitting stack 32 of the light-emitting diode according to the twelfth embodiment of the present disclosure is shown in FIG. 21. As shown in FIG. 22, the curve L221 is the waveform of the broadband blue spectrum of the light-emitting diode before being packaged, and the curve L222 is the waveform of the broadband blue spectrum of the light-emitting diode after being packaged.

As shown in FIG. 22, each of the spectrum waveforms L221 (before the packaging process), L222 (after the packaging process) has a main peak and a shoulder peak located at the right side of the main peak.

The main peak points P2211 and P2221 of the spectrum waveform L221 and L222 are located within a range from 435 nm to 455 nm and correspond to the maximum luminous intensities. In the present embodiment, the intensity of the main peak point P2211 is defined as 100% to normalize the spectrum waveform L221. In addition, the intensity of the main peak point P2221 is defined as 100% to normalize the spectrum waveform L222. It should be noted that the wavelength corresponding to the main peak point P2211 or P2221 is the second wavelength of the second sub-light beam L2.

In the present embodiment, due to the first sub-light beam L1 generated by the first well layer 321a, each of the spectrum waveforms L221 and L222 has a shoulder peak located at the right side of the main peak point P2211 or P2221, and a maximum value or inflection point P2212, P2222 are presented between 490 nm and the wavelength that is equal to the wavelength of the main peak point P2211 or P2221 plus 10 nm.

Figure 23:
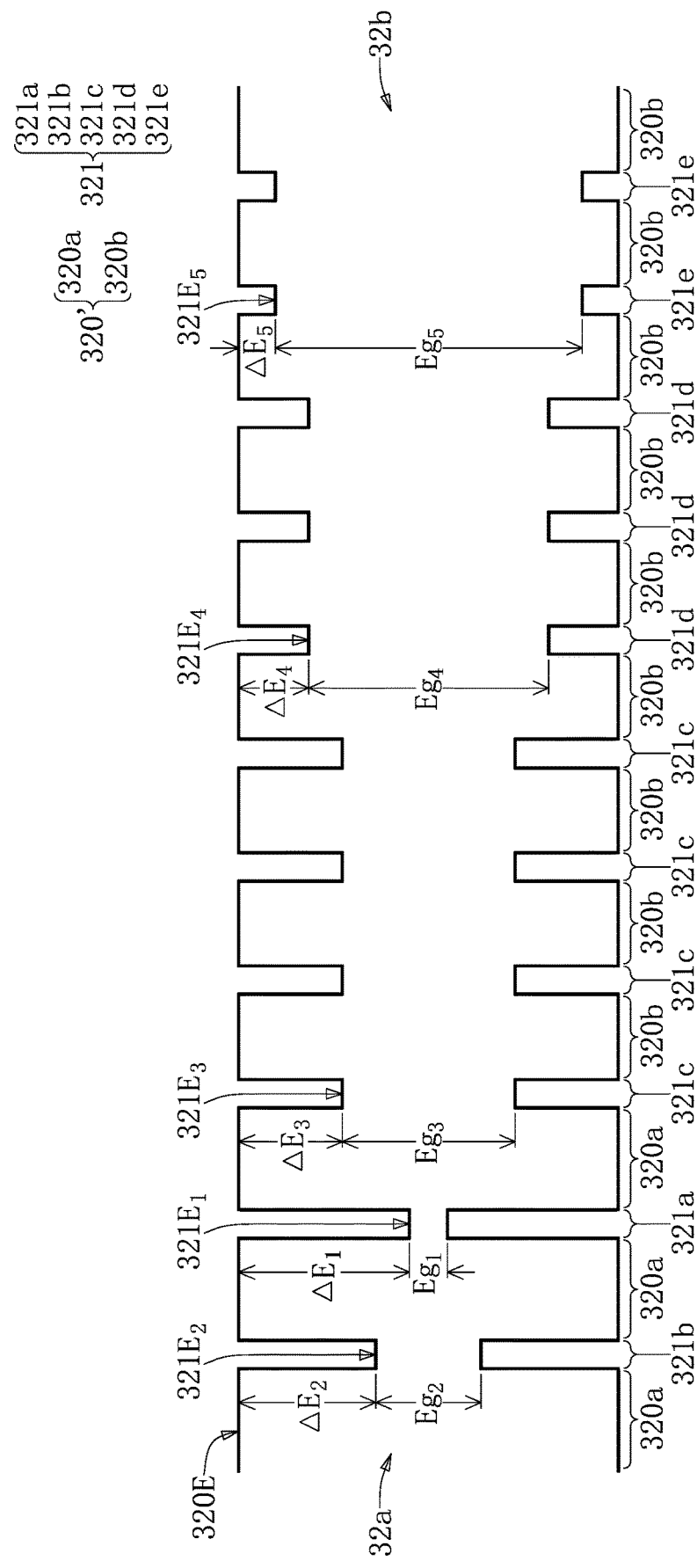
FIG. 23 is a schematic view of an energy band structure of a light-emitting stack according to a thirteenth embodiment of the present disclosure.

Reference is made to FIG. 23 which is the schematic view of the energy band structure of the light-emitting stack of the thirteenth embodiment of the present disclosure. In the present embodiment, the well layers 321 of the light-emitting stack 32 (eleven layers are depicted in FIG. 23) include first well layers 321a, second well layers 321b, third well layers 321c, fourth well layers 321d and fifth well layers 321e. The energy band gap $Eg_1$~$Eg_5$ of the first to fifth well layers 321a~321e increases sequentially for generating first to fifth sub-light beams with different wavelengths.

Furthermore, the well layer 321 closest to the N-type semiconductor layer 30 (the first side 32a) is the second well layer 321b, and the well layer 321 that is the second closest to the N-type semiconductor layer 30 (the first side 32a) is the first well layer 321a. The well layers 321 that are the third to sixth closest to the N-type semiconductor layer 30 (the first side 32a) are the third well layers 321c, and the well layers 321 that are the seventh to ninth closest to the N-type semiconductor layer 30 (the first side 32a) are the fourth well layers 321d. In addition, both of the well layers 321 that are closest and the second closest to the P-type semiconductor layer 31 (the second side 32b) are the fifth well layers 321e.

In addition, in the present embodiment, the barrier layer 320' include at least a plurality of first barrier layers 320a and a plurality of second barrier layers 320b, and the thickness T1 of each of the first barrier layers 320a is greater than the thickness T2 of each of the second barrier layers 320b. Furthermore, in an embodiment, the thickness T1 of the first barrier layer 320a is 1 to 1.5 times the thickness T2 of the second barrier layer 320b. Preferably, the thickness T1 of the first barrier layer 320a is 1.2 to 1.5 times the thickness T2 of the second barrier layer 320b.

In the present embodiment, the three barrier layers 320' that are closest to the N-type semiconductor layer 30 (the first side 32a) are the thicker first barrier layers 320a, and other barrier layers 320' are the second barrier layer 320b. That is, each of the barrier layers 320' that are connected to the first well layer 321a and the second well layer 321b is the first barrier layer 320a.

Overall, in the present embodiment, there is only one first well layer 321a and one second well layer 321b, four third well layers 321c, three fourth well layers 321d and two fifth well layers 321e. Since the number of the third well layers 321c is the largest, the third sub-light beam L3 generated by the third well layers 321c has the highest luminous intensity.

Although there is only one first well layer 321a and one second well layer 321b, the first barrier height $\Delta E_1$ formed between the first well layer 321a and the barrier layer 320' and the second barrier height $\Delta E_2$ formed between the second well layer 321b and the barrier layer 320' are relatively higher, and the barrier layers 320' connected to two sides of the first well layer 321a and the second well layer 321b are the thicker first barrier layers 320a so that electrons can be more easily trapped in the first and second well layers 321a, 321b. Therefore, the first sub-light beam L1 generated by the first well layer 321a and the second sub-light beam L2 generated by the second well layer 321b still have certain luminous intensities, respectively, so that the broadband blue spectrum generated by the light-emitting stack 32 has a wider FWHIM or two or more peaks.

Figure 24:
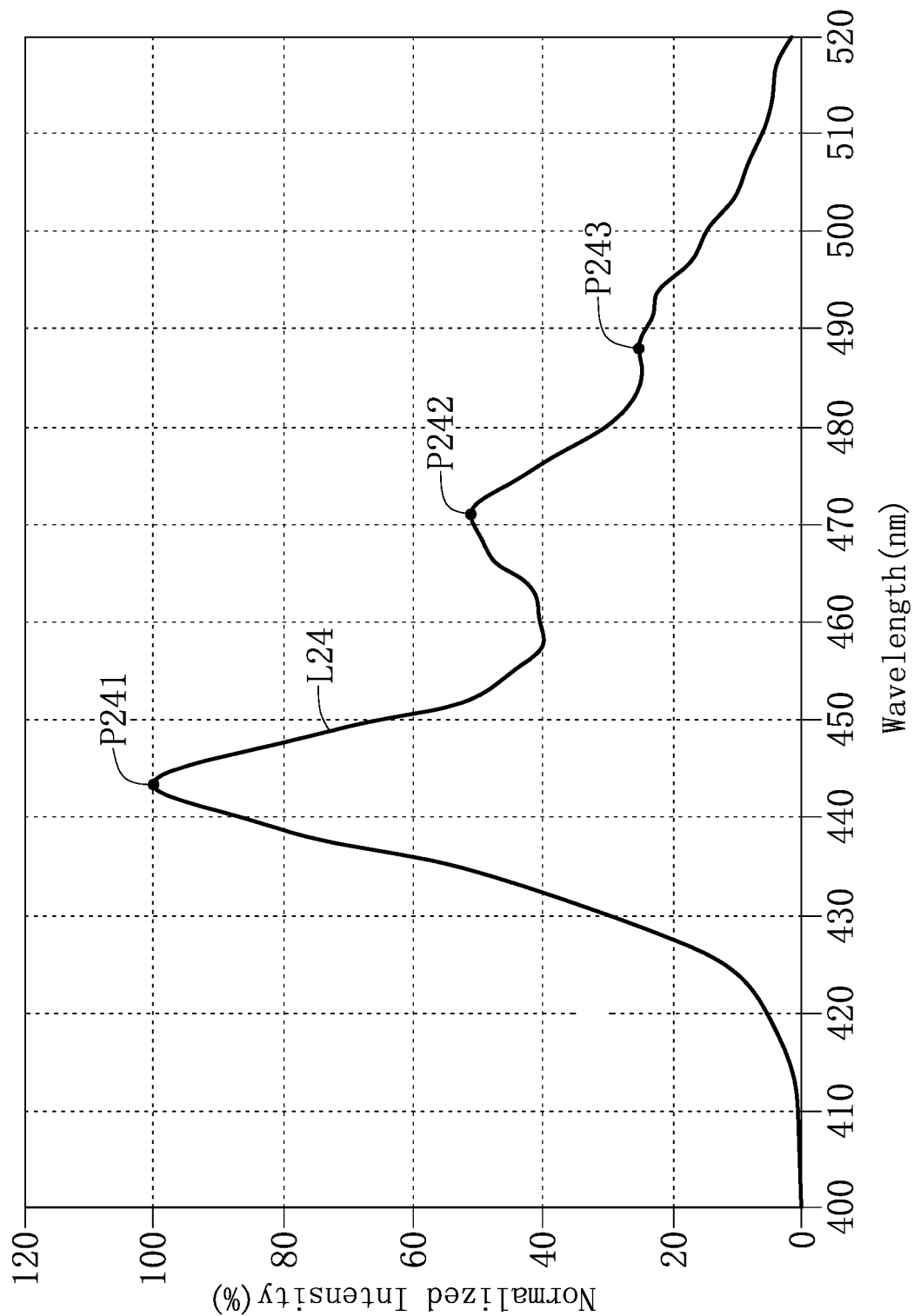
FIG. 24 is a broadband blue spectrum of a light-emitting diode according to the thirteenth embodiment of the present disclosure.

Reference is made to FIG. 24 which shows the broadband blue spectrum of the light-emitting diode of the thirteenth embodiment of the present disclosure. The first to fifth sub-light beams generated by the light-emitting diode are mixed to form the spectrum shown in FIG. 24.

As shown in FIG. 24, the waveform L24 of the broadband blue spectrum of the present embodiment has a main peak with a main peak point P241. In the present embodiment, the intensity of the main peak point P241 is defined as 100% to normalize the waveform of the spectrum.

As shown in FIG. 24, the luminous intensity of the main peak point P241 is highest, and the main peak point P241 falls within a range from 430 nm to 450 nm. In the present embodiment, the wavelength corresponding to the main peak point P241 corresponds to the third wavelength of the third sub-light beam L3. That is, by changing the energy band gap $Eg_3$, the wavelength corresponding to the main peak point P241 can be adjusted.

In addition, in the broadband blue spectrum, two shoulder peaks are located at the right side of the main peak point P241 (the longer wavelength side). Furthermore, the shoulder peak that is closest to the main peak point P241 has a relative maximum P242 (i.e., peak point of the shoulder peak), and the relative maximum P242 is located within the range from 460 nm to 480 nm.

The wavelength corresponding to the relative maximum P242 is also related to the energy band gap $Eg_2$ of the second well layer 321b. Therefore, the difference between the wavelength corresponding to the relative maximum P242 and the main peak point P241 can be adjusted by adjusting the energy band gap $Eg_2$ of the first well layer 321b.

In addition, due to another shoulder peak that is located at the right side of the main peak point P241 and the second closest to the main peak point P241, the spectrum waveform has another relative maximum P243 falling within a range from 480 nm to 500 nm. Similarly, the wavelength corresponding to the relative maximum P243 is related to the energy band gap $Eg_1$ of the first well layer 321a. Therefore, the difference between the wavelengths respectively corresponding to the relative maximum P243 and the main peak point P241 can be adjusted by adjusting the energy band gap $Eg_1$ of the first well layer 321a.

In an embodiment, the fourth wavelength of the fourth sub-light beam generated by the fourth well layer 321d differs from the third wavelength of the third sub-light beam L3 generated by the third well layer 321c by less than 15 nm. In addition, the difference between the fourth wavelength and the fifth wavelength of the fifth sub-light beam generated by the fifth well layer 321e is less than 10 nm. Therefore, in the spectrum waveform L24 shown in FIG. 24, the third sub-light beam L3, the fourth sub-light beam and the fifth sub-light beam overlap with one another so that the main peak has a broader profile.

Figure 25:
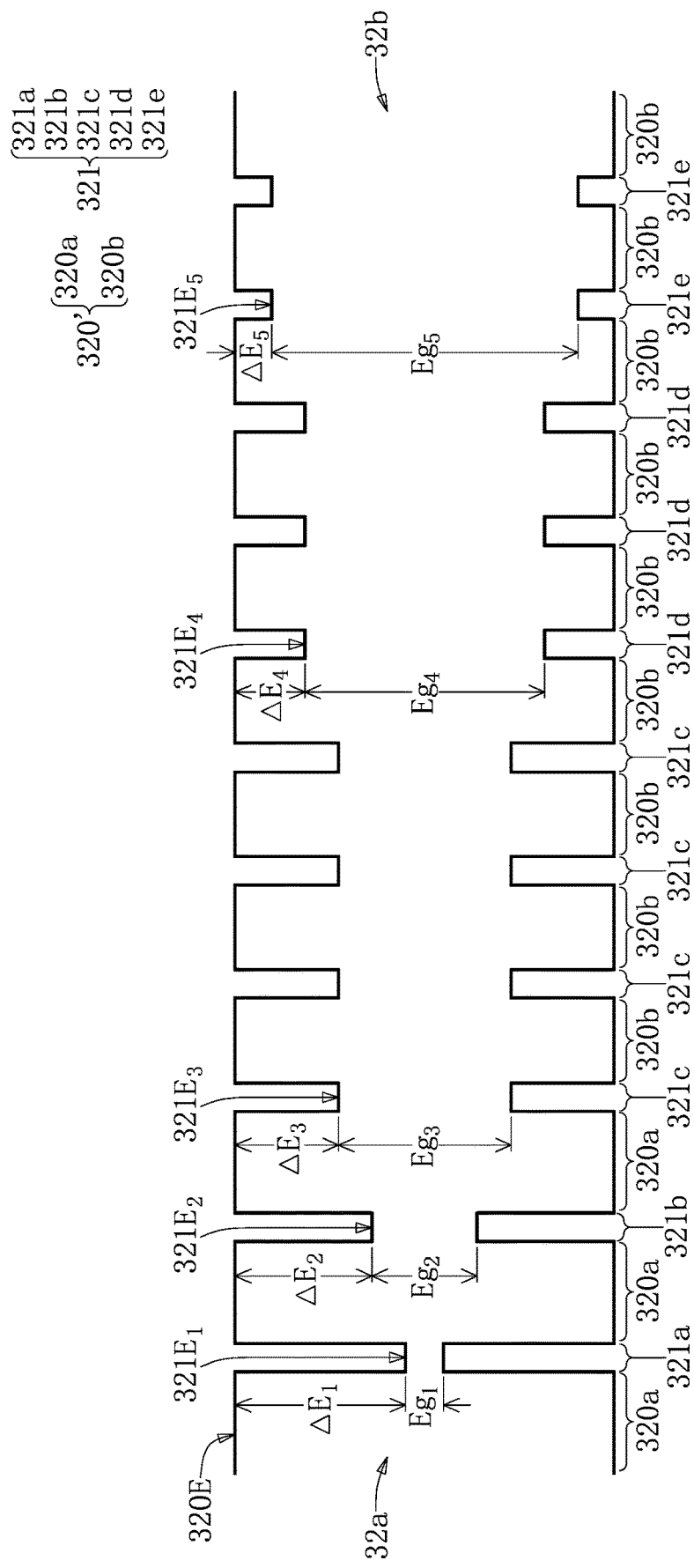
FIG. 25 is a schematic view of an energy band structure of a light-emitting stack according to a fourteenth embodiment of the present disclosure.

Reference is made to FIG. 25. FIG. 25 is a schematic view of an energy band structure of a light-emitting stack of a fourteenth embodiment of the present disclosure. One of the differences between the present embodiment and the thirteenth embodiment shown in FIG. 23 is that the locations of the first well layers 321a and the second well layers 321b are swapped. In other words, in the present embodiment, the well layer 321 that is closest to the N-type semiconductor layer 30 (the first side 32a) is the first well layer 321a, and the well layer 321 that is the second closest to the N-type semiconductor layer 30 (the first side 32a) is the second well layer 321b. In other words, even if the locations of the first well layer 321a and the second well layers 321b are swapped, a broadband blue spectrum as shown in FIG. 24 may be achieved, and the waveform of the spectrum may have a larger FWHM and a plurality of peaks (including a main peak and two shoulder peaks at the right side of the main peak).

Figure 26:
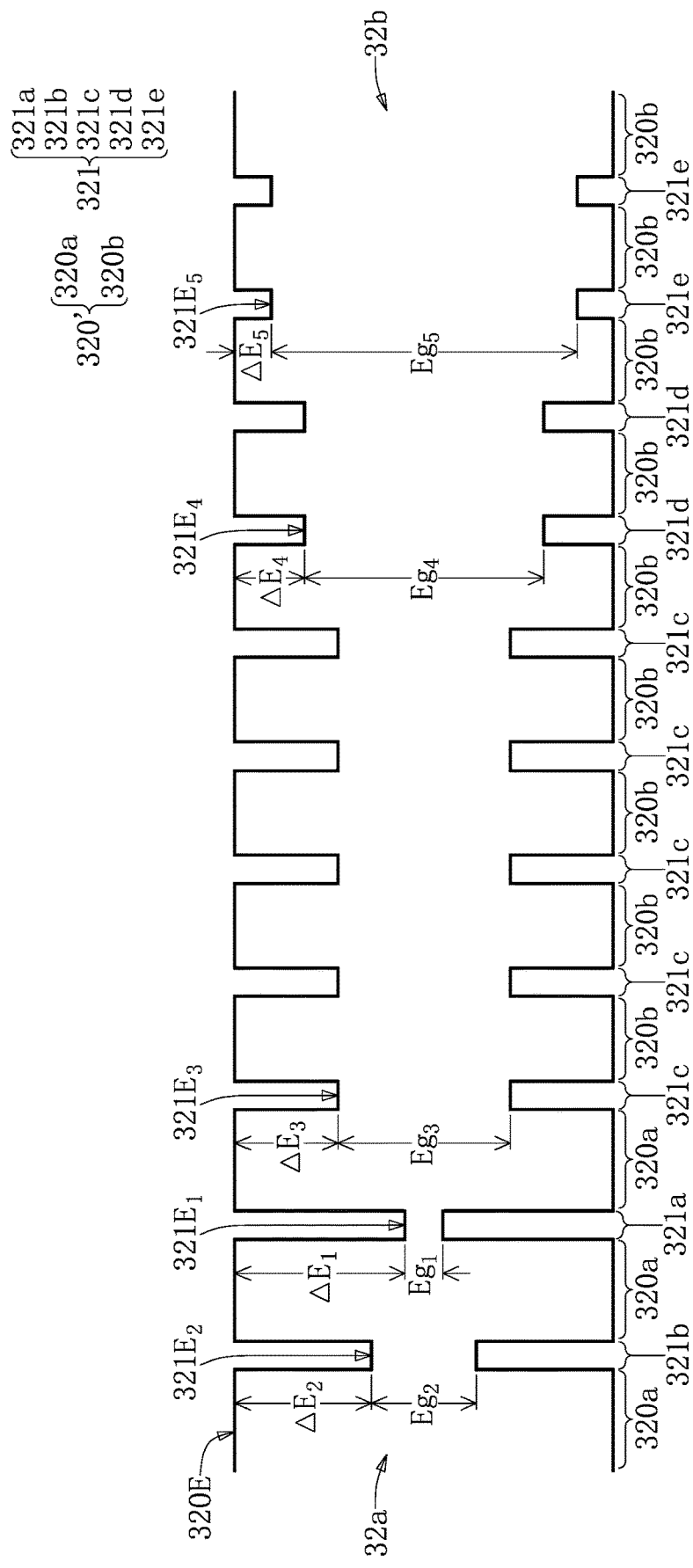
FIG. 26 is a schematic view of an energy band structure of a light-emitting stack according to a fifteenth embodiment of the present disclosure.

In addition, the numbers of the third well layer 321c, the fourth well layer 321d and the fifth well layer 321e are not required to be the same and can be adjusted based on actual requirements. Reference is made to FIG. 26 which is a schematic view of an energy band structure of a light-emitting stack of a fifteenth embodiment of the present disclosure. One of the differences between the present embodiment and the thirteenth embodiment shown in FIG. 23 is that the number of the third layers 321c is five, the number of the fourth well layers 321d is two and the number of the fifth well layers 321e is two in the present embodiment.

Figure 27:
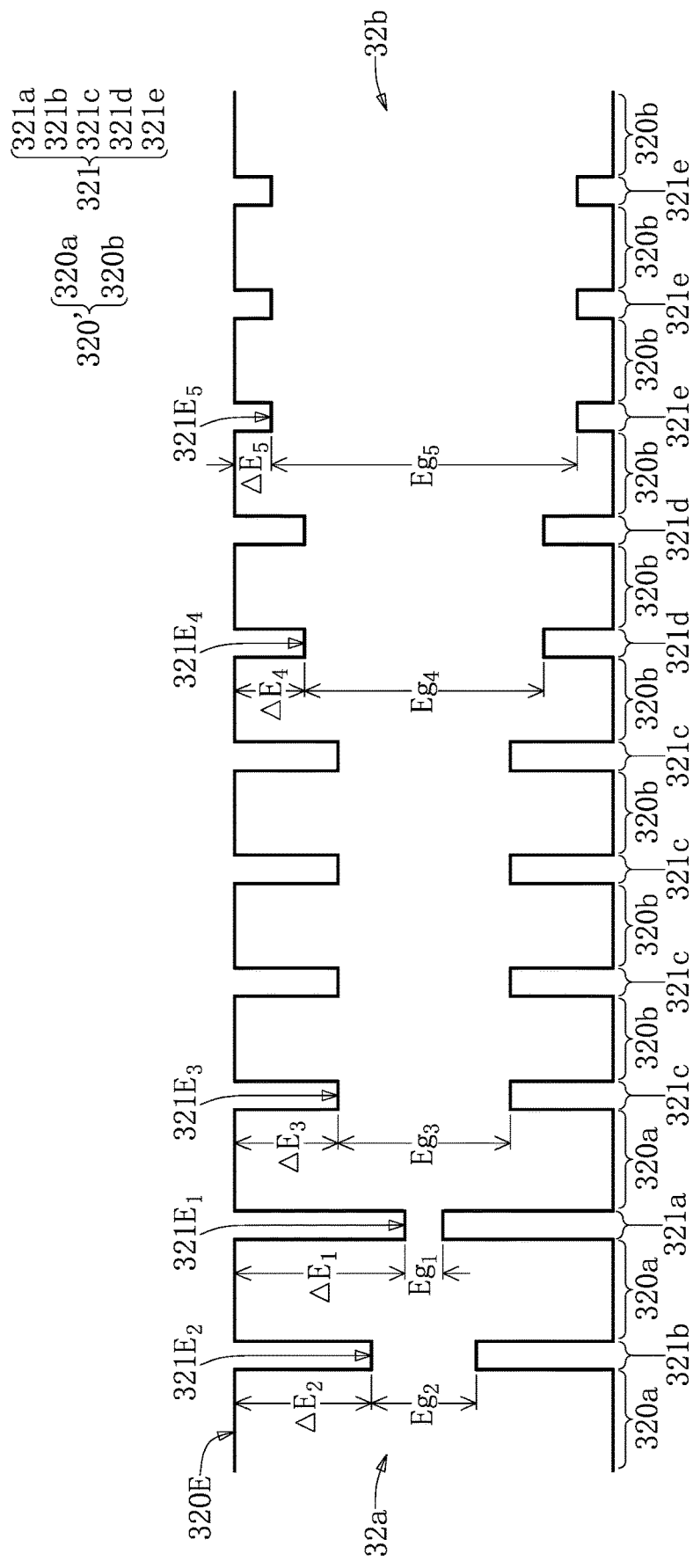
FIG. 27 is a schematic view of an energy band structure of a light-emitting stack according to a sixteenth embodiment of the present disclosure.

Reference is made to FIG. 0.27. FIG. 27 is a schematic view of an energy band structure of a light-emitting stack of a sixteenth embodiment of the present disclosure. One of the differences between the present embodiment and the thirteenth embodiment shown in FIG. 23 is that the number of the third well layers 321c is four, the number of the fourth well layers 321d is two and the number of the fifth well layers 321e is three in the present embodiment. Accordingly, as long as the number of the third well layers 321c is the largest among the well layers, the numbers of the third well layers 321c, the fourth well layers 321d and the fifth well layers 321e are not limited in the embodiments of the present disclosure.

Figure 28:
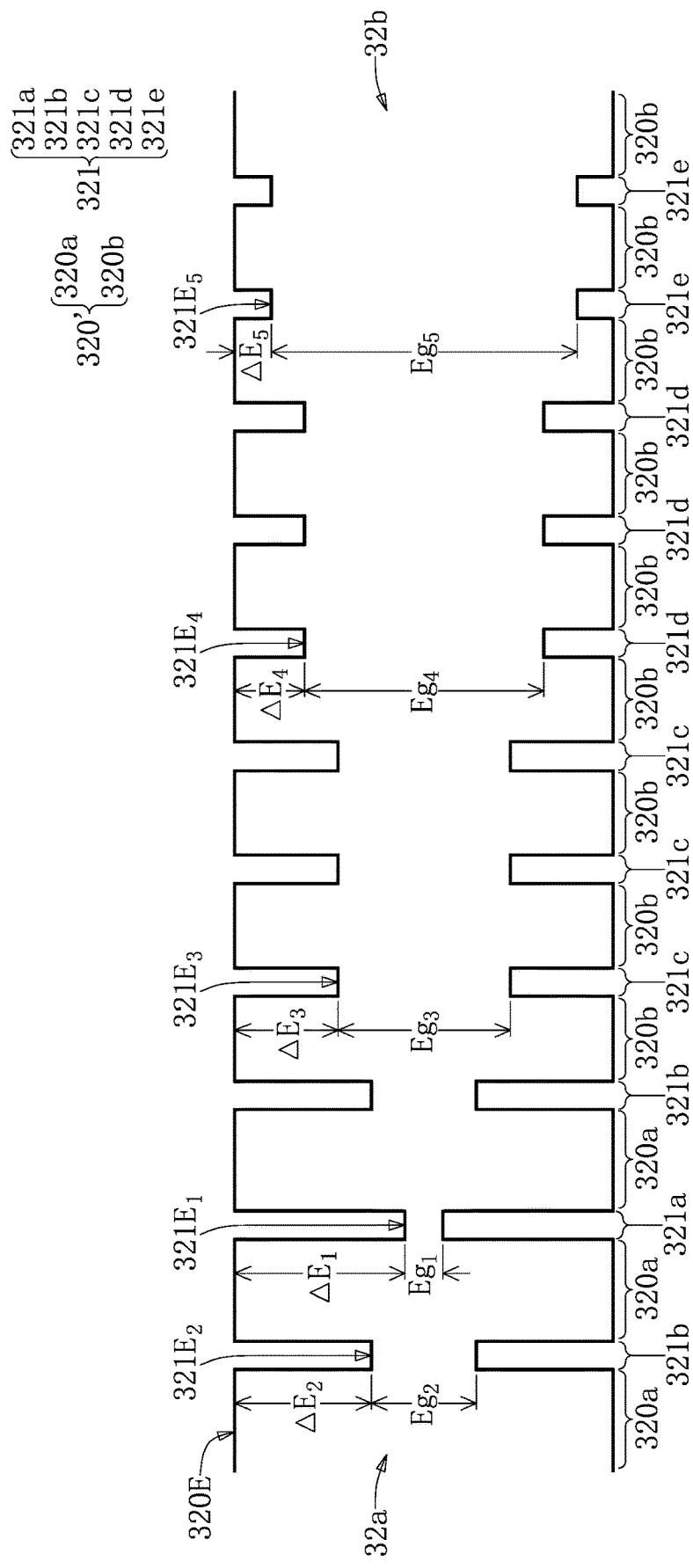
FIG. 28 is a schematic view of an energy band structure of a light-emitting stack according to a seventeenth embodiment of the present disclosure.

Reference is made to FIG. 28. FIG. 28 is a schematic view of a forbidden structure of a light-emitting stack of a seventeenth embodiment of the present disclosure. One of the differences between the present embodiment and the thirteenth embodiment shown in FIG. 23 is that the number of the second well layers 321b is two and the number of the third well layers 321c is three in the present embodiment.

Furthermore, the well layer 321 closest to the N-type semiconductor layer 30 (the first side 32a) and the well layer that is the third closest to the N-type semiconductor layer 30 (the first side 32a) are both second well layers 321b, and the well layer that is the second closest to the N-type semiconductor layer 30 (the first side 32a) is a first well layer 321a. In other words, the first well layer 321a is located between two second well layers 321b.

Figure 29:
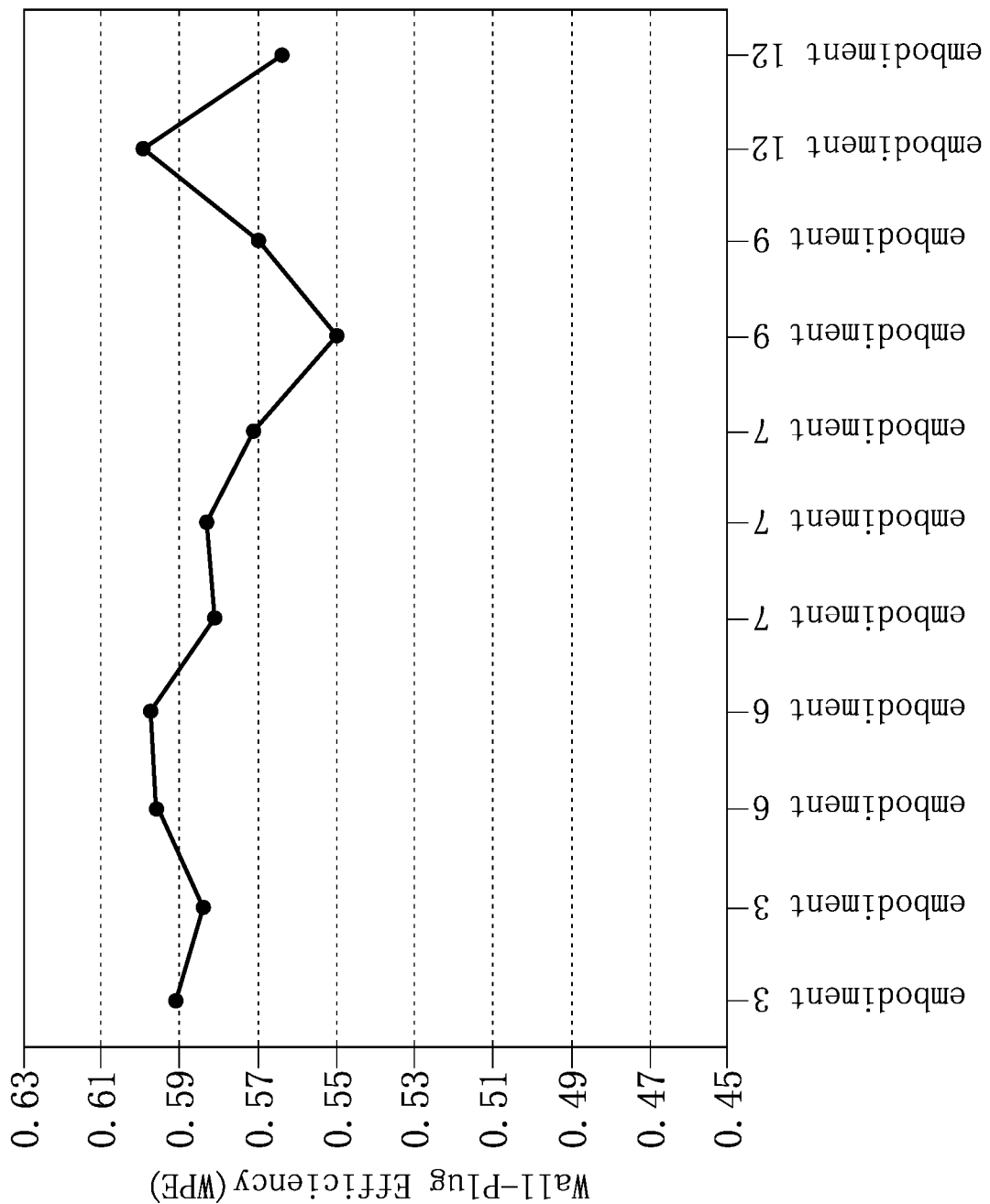
FIG. 29 shows the Wall-Plug-Efficiency of each of the light-emitting diodes according to different embodiments of the present disclosure.

Reference is made to FIG. 29. FIG. 29 shows the Wall-Plug-Efficiencies (WPE) of the light-emitting diodes of different embodiments of the present disclosure. The Wall-Plug-Efficiencies of the light-emitting diodes M of these embodiments are measured under the conditions of 25° C. and an operating current density of 120 mA/mm$^2$. Specifically, a 26×30 mil$^2$ chip is driven by a current of 60 mA for measuring the Wall-Plug-Efficiencies (WPE).

As shown in FIG. 29, under the operating current density of 120 mA/mm$^2$, the plurality of light-emitting diodes M of the embodiments of the present disclosure (including the light-emitting stacks 32 of the third embodiment, the sixth embodiment, the seventh embodiment, the ninth embodiment and the twelfth embodiment) have a Wall-Plug-Efficiency of larger than 0.45. In a preferable embodiment (including the light-emitting stack 32 of the twelfth embodiment), the Wall-Plug-Efficiency is even larger than 0.59.

However, it should be mentioned that the light-emitting diodes M provided by the embodiments of the present disclosure have a Wall-Plug-Efficiency of larger than 0.45 under an operating current density of 120 mA/mm$^2$. Therefore, the light-emitting diodes provided by the embodiments of the present disclosure can not only generate a light beam with broadband blue spectrum but also have a better Wall-Plug-Efficiency.

In sum, one of the advantages of the present disclosure is that the spectrum of the epitaxial light-emitting structure 3 can have larger FWHM or a plurality of peaks based on the technical features of "the plurality of well layers 321 are divided into at least first well layers 321a and second well layers 321b." As such, the spectrum of the white light generated by the light-emitting diode module Z1 can satisfy the demands of a full spectrum or a healthy spectrum so as to be applied in different luminous environments.

Furthermore, a light beam with broadband blue spectrum can be generated by adjusting the indium concentrations in each of the well layers 321 of the epitaxial light-emitting structure 3 of the light-emitting diode M. Therefore, the light-emitting diode Z13 of the embodiments of the present disclosure not only can generate light beams that meets the requirements of the natural light spectrum but also is suitable in application related to healthy spectrum and can be widely used in different applications.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting diode, comprising:
a P-type semiconductor layer;
a N-type semiconductor layer; and
a light-emitting stack located between the N-type semiconductor layer and the P-type semiconductor layer configured to generate a light beam with a broadband blue spectrum, wherein the light-emitting stack includes a plurality of well layers and a plurality of barrier layers that are alternately stacked, the well layers include at least one first well layer, at least one second well layer and third well layers different in indium concentrations, wherein the first well layer has the largest indium concentration, and the third well layers have the smallest indium concentration,
wherein three of well layers that are closest to the P-type semiconductor layer are the third well layers, and the first well layer is closer to the N-type semiconductor layer than the P-type semiconductor layer.

2. The light-emitting diode according to claim 1, wherein each of the barrier layers is made of gallium nitride, and each of the well layers is made of indium gallium nitride, an indium concentration of each of the third well layers ranges from 12% to 14%, an indium concentration of each of the second well layers ranges from 15% to 17%, and an indium concentration of the at least one first well layer ranges from 18% to 20%.

3. The light-emitting diode according to claim 1, wherein one of the well layers that is the second or third closest to the N-type semiconductor layer is the at least one first well layer.

4. The light-emitting diode according to claim 1, wherein the at least one first well layer is configured to generate a first sub-light beam with a first wavelength, the second well layers are used to generate a second sub-light beam with a second wavelength, and the third well layers are used to generate a third sub-light beam with a third wavelength, a difference between the first wavelength and the second wavelength ranges from 10 nm to 30 nm, and a difference between the first wavelength and the third wavelength ranges from 20 nm to 70 nm.

5. The light-emitting diode according to claim 1, wherein a number of the first well layer is less than a number of the third well layers.

6. The light-emitting diode according to claim 1, the at least one first well layer is located between two of the second well layers.

7. The light-emitting diode according to claim 1, wherein a waveform of the broadband blue spectrum has a full width at half maximum (FWHM) of at least 20 nm.

8. The light-emitting diode according to claim 1, wherein the light-emitting stack is configured to generate a light beam with a broadband blue spectrum, and a waveform of the broadband blue spectrum has at least two peaks.

9. The light-emitting diode according to claim 8, wherein the waveform of the broadband blue spectrum has three peaks and the peak with the longest wavelength has the weakest luminous intensity.

10. The light-emitting diode according to claim 8, wherein one of the at least two peaks corresponds to a wavelength range of 435 nm~445 nm.

11. The light-emitting diode according to claim 10, wherein the peak corresponding to the wavelength range of 435 nm~445 nm has the strongest luminous intensity of the at least two peaks.

12. The light-emitting diode according to claim 10, wherein the peak corresponding to the wavelength range of 435 nm~445 nm has the second strongest luminous intensity of the at least two peaks.

13. A light-emitting diode, comprising:
a hole injection layer;
an electron injection layer; and
a light-emitting stack located between the electron injection layer and the hole injection layer configured to generate a light beam with a broadband blue spectrum, wherein the light-emitting stack includes a plurality of well layers and a plurality of barrier layers that are alternately stacked, the well layers include at least one first well layer, at least one second well layer and third well layers that are different in indium concentrations, wherein the first well layer has the largest indium concentrations, and the third well layers have the smallest indium concentration, wherein a waveform of the broadband blue spectrum has at least two peaks, and wherein three of well layers that are closest to the hole injection layer are the third well layers.

14. The light-emitting diode according to claim 13, wherein the waveform of the broadband blue spectrum has three peaks and the peak with the longest wavelength has the weakest luminous intensity.

15. The light-emitting diode according to claim 13, wherein one of the at least two peaks corresponds to a wavelength range of 435 nm~445 nm.

16. The light-emitting diode according to claim 15, wherein the peak corresponding to the wavelength range of 435 nm~445 nm has the strongest luminous intensity of the at least two peaks.

17. The light-emitting diode according to claim 15, wherein the peak corresponding to the wavelength range of 435 nm~445 nm has the second strongest luminous intensity of the at least two peaks.

18. A light-emitting diode comprising a multiple quantum well structure configured to generate a light beam with a broadband blue spectrum, wherein the waveform of the broadband blue spectrum has at least two peaks, wherein a difference of the wavelength between any two adjacent ones of the at least two peaks ranges from 1 nm to 50 nm, and the light-emitting diode has a Wall-Plug-Efficiency (WPE) of greater than 0.45 under an operating current density of 120 mA/mm2.

19. The light-emitting diode according to claim 18, wherein the light-emitting diode includes a plurality of well layers and a plurality of barrier layers that are alternately stacked, the well layers include at least one first well layer, at least one second well layer and at least one third well layer different in indium concentrations.

* * * * *